United States Patent
Krippner et al.

(10) Patent No.: US 10,697,275 B2
(45) Date of Patent: Jun. 30, 2020

(54) ELECTRICAL POWER TRANSMISSION FOR WELL CONSTRUCTION APPARATUS

(71) Applicant: Schlumberger Technology Corporation, Sugar Land, TX (US)

(72) Inventors: Nick Paul Krippner, Houston, TX (US); Carlos White, Houston, TX (US); Jacques Orban, Houston, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 163 days.

(21) Appl. No.: 15/676,035

(22) Filed: Aug. 14, 2017

(65) Prior Publication Data

US 2019/0048687 A1 Feb. 14, 2019

(51) Int. Cl.
*E21B 41/00* (2006.01)
*E21B 15/00* (2006.01)
*E05B 65/52* (2006.01)
*E05B 11/02* (2006.01)
*H02G 15/10* (2006.01)
(Continued)

(52) U.S. Cl.
CPC .............. *E21B 41/00* (2013.01); *E05B 11/02* (2013.01); *E05B 19/00* (2013.01); *E05B 65/52* (2013.01); *E21B 15/003* (2013.01); *G01R 31/025* (2013.01); *G01R 31/026* (2013.01); *G01R 31/04* (2013.01); *G01R 31/043* (2013.01);
(Continued)

(58) Field of Classification Search
CPC ........... H02M 1/00; H02M 1/08; E21B 41/00; E21B 15/003; E05B 65/52; E05B 11/02; E05B 19/00; H02G 9/04; H02G 15/10; H01R 24/28; H01R 2103/00
See application file for complete search history.

(56) References Cited

U.S. PATENT DOCUMENTS 421,781 A 12/1899 Stoughton
3,270,267 A 8/1966 Nolte, Jr.
(Continued)

FOREIGN PATENT DOCUMENTS

JP H0413543 A 1/1991
WO 2007019292 A2 2/2007
(Continued)

OTHER PUBLICATIONS

Cat ® MD6640 Rotary Blasthole Drill, Brochure, 4 pages, 2013.
(Continued)

*Primary Examiner* — Matthew V Nguyen
(74) *Attorney, Agent, or Firm* — Rachel E. Greene

(57) ABSTRACT

Apparatus and methods pertaining to a moveable well construction apparatus to be electrically energized via an electrical power transmission path extending between a stationary power source and the moveable well construction apparatus. The path comprises cables and connectors. A system comprises a detector operable for generating information indicative of whether the path is properly installed. The system permits the path to be electrically energized when the detector-generated information indicates the path is properly installed, and prevents the path from being electrically energized when the detector-generated information indicates the path is not properly installed.

12 Claims, 16 Drawing Sheets

(51) Int. Cl.
  *G01R 31/04* (2006.01)
  *E05B 19/00* (2006.01)
  *G01R 31/02* (2006.01)
  *H02G 9/04* (2006.01)
  *H01R 103/00* (2006.01)
  *H01R 24/28* (2011.01)

(52) U.S. Cl.
  CPC .............. *H02G 9/04* (2013.01); *H02G 15/10* (2013.01); *H01R 24/28* (2013.01); *H01R 2103/00* (2013.01)

(56) References Cited

U.S. PATENT DOCUMENTS

| | | | |
|---|---|---|---|
| 3,802,137 | A | 4/1974 | Armstrong |
| 4,345,650 | A | 8/1982 | Wesley |
| 4,751,969 | A | 6/1988 | Klaeger |
| 4,795,893 | A | 1/1989 | Ugon |
| 5,292,108 | A | 3/1994 | Sutton |
| 6,268,574 | B1 | 7/2001 | Edens |
| 6,675,888 | B2 * | 1/2004 | Schempf .................. E21B 4/18 166/65.1 |
| 6,731,562 | B2 | 5/2004 | Roohparvar |
| 6,971,457 | B2 | 12/2005 | Baird |
| 7,165,619 | B2 | 1/2007 | Fox et al. |
| 7,181,370 | B2 * | 2/2007 | Furem .................. E02F 9/205 701/50 |
| 7,849,924 | B2 * | 12/2010 | Surjaatmadja ........ E21B 43/114 166/177.5 |
| 8,299,748 | B2 | 10/2012 | Soma et al. |
| 8,332,106 | B2 | 12/2012 | Yuet et al. |
| 8,881,806 | B2 | 11/2014 | Xie et al. |
| 9,360,134 | B2 | 6/2016 | Orgeron et al. |
| 9,644,431 | B2 | 5/2017 | Myers et al. |
| 9,850,111 | B2 | 12/2017 | Trevisani |
| 2002/0175522 | A1 | 11/2002 | Wacknov et al. |
| 2007/0096538 | A1 | 5/2007 | Niemi et al. |
| 2007/0150149 | A1 * | 6/2007 | Peterson ................ E02F 3/437 701/50 |
| 2007/0199872 | A1 | 8/2007 | Mueller et al. |
| 2008/0099197 | A1 | 5/2008 | Payne |
| 2008/0314579 | A1 | 12/2008 | Den Boer et al. |
| 2009/0188677 | A1 | 7/2009 | Ditta et al. |
| 2009/0214196 | A1 | 8/2009 | Bremnes |
| 2009/0283324 | A1 | 11/2009 | Konduc et al. |
| 2009/0321135 | A1 | 12/2009 | Vora |
| 2010/0089584 | A1 | 4/2010 | Burns |
| 2010/0143044 | A1 | 6/2010 | Kadaster et al. |
| 2011/0280104 | A1 | 11/2011 | McClung |
| 2011/0281447 | A1 | 11/2011 | Kano et al. |
| 2013/0140092 | A1 | 6/2013 | Warr |
| 2013/0180186 | A1 | 7/2013 | Konduc et al. |
| 2013/0315676 | A1 | 11/2013 | Orgeron et al. |
| 2014/0048286 | A1 | 2/2014 | Rojas et al. |
| 2014/0251623 | A1 | 9/2014 | Lestz et al. |
| 2015/0114652 | A1 | 4/2015 | Lestz et al. |
| 2015/0114717 | A1 | 4/2015 | Fortson et al. |
| 2015/0267487 | A1 | 9/2015 | Bujold et al. |
| 2015/0361784 | A1 | 12/2015 | Davis |
| 2016/0195911 | A1 | 7/2016 | Chapel et al. |
| 2016/0293294 | A1 | 10/2016 | Matlack et al. |
| 2017/0044894 | A1 | 2/2017 | Surowinski et al. |
| 2019/0049909 | A1 * | 2/2019 | Krippner .............. G05B 19/042 |
| 2019/0051431 | A1 * | 2/2019 | Orban .................. H01B 9/003 |
| 2019/0065789 | A1 | 2/2019 | Gonchar et al. |

FOREIGN PATENT DOCUMENTS

| | | |
|---|---|---|
| WO | 2010070305 A2 | 6/2010 |
| WO | 2017119896 A1 | 7/2017 |

OTHER PUBLICATIONS

Loadmaster, "Land, Desert, Arctic, or Offshore Our Drilling Equipment is Meticulously Designed", www.loadmasterur.com, 38 pages, 2017.

Joy Global, General Specification: 320XPC Rotary Blasthole Drill, joyglobal.com, 4 pages, 2016.

Conductix Wampfler, "Giant Land-based Oil Rigs Become Mobile with Conductix-Wampfler Cable Reels", Jul. 18, 2016, 3 pages, http://www.conductix.us/en/news/2016-07-18/giant-land-based-oil-rigs-become-mobile-conductix-wampfler-cable-reels.

Nexans AmerCable, Zone 1 (EX) Rated Cable Assemblies: Offhsore Bridle Systems—Tender Assisted drilling Unit/Bridle and Festoon Systems, 4 pages, 2014, http://www.amercable.com/doc/catalogs/og/bridle.pdf.

Varhaug, "Subsea Infrastructure", Schlumberger, Oilfield Review 2016, 2 pages, 2016, http://www.slb.com/-/media/Files/resources/oilfield_review/defining_series/Defining-Subsea-Infrastructure.pdf?a=en&hash=C5D993CA2AF08B14F36ECFC7DD18CB9D48AF7F52.

P&H, P&H 320XPC Blasthold Drill, accessed via http://pdf.directindustry.com/pdf/joy-global-surface-mining-p-h-mining-equipment-i/p-h-320xpc/40115-154681.html; 6 pages, 2009.

Joy Global, 320XPC Rotary Blasthole Drill Product Overview, accessed via http://pdf.directindustry.com/pdf/joy-global-surface-mining-p-h-mining-equipment-i/p-h-320xpc/40115-378357.html; 8 pages, 2012.

Caterpillar, Land Righ SCR Power Podules, Caterpillar Inc., 4 pages, 1999.

Bentec Drilling Rigs. Brochure [online]. Bentec GmbH Drilling Oilfield Systems, Germany, Dec. 2016. Retrieved from the Internet: URL: https://www.bentec.com/wp-content/uploads/2016/12/Bentec_Drilling_Rigs_EN_122016.pdf, 11 Pages.

* cited by examiner

ELECTRICAL POWER TRANSMISSION FOR WELL CONSTRUCTION APPARATUS

BACKGROUND OF THE DISCLOSURE

In the drilling of oil and gas wells, drilling rigs are used to create a well by drilling a wellbore into a formation to reach oil and gas deposits. During the drilling process, as the depth of the wellbore increases, so does the length and weight of the drillstring. A drillstring may include sections of drill pipe, a bottom hole assembly, and other tools for creating a well. The length of the drillstring may be increased by adding additional sections of drill pipe as the depth of the wellbore increases. Various components of a drilling rig can be used to advance the drillstring into the formation. In some applications, several wells may be drilled on the same pad with limited separation distance. In such application, a portion of the drilling rig may remain static during the process of multiple well construction, while a central package (i.e., a central portion) may be moved above a well to be drilled.

SUMMARY OF THE DISCLOSURE

This summary is provided to introduce a selection of concepts that are further described below in the detailed description. This summary is not intended to identify indispensable features of the claimed subject matter, nor is it intended for use as an aid in limiting the scope of the claimed subject matter.

The present disclosure introduces an apparatus including a stationary side, a moveable well construction apparatus, and a system including a detector. The stationary side includes a stationary power source. The moveable well construction apparatus is electrically energized via an electrical power transmission path extending between the stationary power source and the moveable well construction apparatus. The electrical power transmission path includes one or more electrical power cables and one or more electrical connectors. The detector is operable for generating information indicative of whether the electrical power transmission path is properly installed between the stationary power source and the moveable well construction apparatus. The system is operable for permitting the electrical power transmission path to be electrically energized when the detector-generated information is indicative of the electrical power transmission path being properly installed between the stationary power source and the moveable well construction apparatus, and for prohibiting the electrical power transmission path from being electrically energized when the detector-generated information is indicative of the electrical power transmission path not being properly installed between the stationary power source and the moveable well construction apparatus.

The present disclosure also includes a method including moving a moveable well construction apparatus relative to a stationary side. The stationary side includes a stationary power source. The moveable well construction apparatus is electrically energized via an electrical power transmission path extending between the stationary power source and the moveable well construction apparatus. The electrical power transmission path includes one or more electrical power cables and one or more electrical connectors. The method also includes operating a system having a detector operable for generating information indicative of whether the electrical power transmission path is properly installed between the stationary power source and the moveable well construction apparatus. The system is operable for permitting the electrical power transmission path to be electrically energized when the detector-generated information is indicative of the electrical power transmission path being properly installed between the stationary power source and the moveable well construction apparatus, and for prohibiting the electrical power transmission path from being electrically energized when the detector-generated information is indicative of the electrical power transmission path not being properly installed between the stationary power source and the moveable well construction apparatus.

The present disclosure also introduces an apparatus including a power source at a stationary side, an electrical power cable extending from the stationary side to a moveable well construction apparatus, and a first processing system at the moveable well construction apparatus including a processor and a memory including computer program code, the first processing system being operable to transmit a first message. The apparatus also includes a second processing system at the stationary side and including a processor and a memory including computer program code, the second processing system being operable to, receive the first message from the first processing system, receive a second message input through an input device of the second processing system, permit the electrical power cable to be electrically coupled to the power source when the first message and the second message are authorized, and prohibit the electrical power cable from being electrically coupled to the power source when at least one of the first message and the second message is not authorized.

The present disclosure also introduces a method including receiving a first message as user input at a first processing system, the first processing system being at a moveable well construction apparatus and including a processor and a memory including computer program code. The method also includes transmitting the first message from the first processing system and receiving the first message at a second processing system, the second processing system being at a stationary side and including a processor and a memory including computer program code. The method also includes receiving a second message as user input at the second processing system. The method also includes permitting, by the second processing system, an electrical power cable to be electrically coupled to a power source at the stationary side when the first message and the second message are authorized. The method also includes prohibiting, by the second processing system, the electrical power cable from being electrically coupled to the power source when at least one of the first message and the second message is not authorized.

These and additional aspects of the present disclosure are set forth in the description that follows, and/or may be learned by a person having ordinary skill in the art by reading the material herein and/or practicing the principles described herein. At least some aspects of the present disclosure may be achieved via means recited in the attached claims.

BRIEF DESCRIPTION OF THE DRAWINGS

The present disclosure is understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
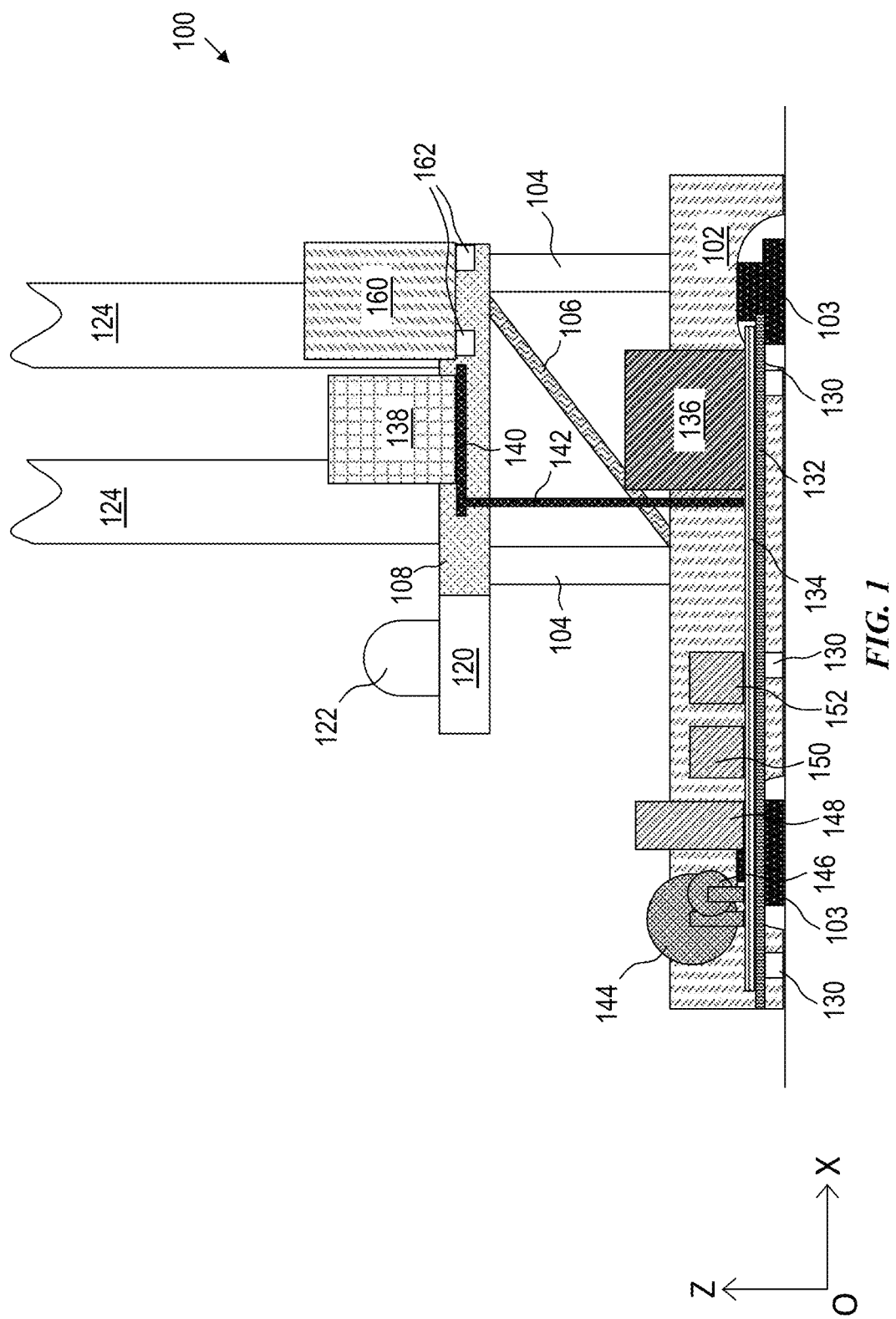
FIG. 1 is a schematic view of at least a portion of an example implementation of apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for simplicity and clarity, and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Systems and methods and/or processes according to one or more aspects of the present disclosure may be used or performed in connection with well construction operations, such as at a wellsite for constructing a wellbore to obtain hydrocarbons (e.g., oil and/or gas) from a formation, including drilling the wellbore. For example, some aspects may be described in the context of drilling a wellbore in the oil and gas industry. One or more aspects of the present disclosure may be applied in other contexts, such as for any construction operations.

One or more aspects of the present disclosure may permit simpler deployment of a well construction apparatus where some components (e.g., electrical components) are located at the moveable well construction apparatus (e.g., "walking" rig) that may be powered by medium-voltage supplied by a medium-voltage power cable, such as a 4,160 V power cable. The power cable may be configured to supply an alternating current (AC) (e.g., 3 phase, 6 phase, etc.) or a direct current (DC). Such power cable may be powered by a power source located at a stationary position at the wellsite and at an end of the power cable. Various examples and modifications are described herein, and a person of ordinary skill in the art will readily understand other modifications that can be made to those examples and modifications, which are within the scope of the present disclosure.

Figure 2:
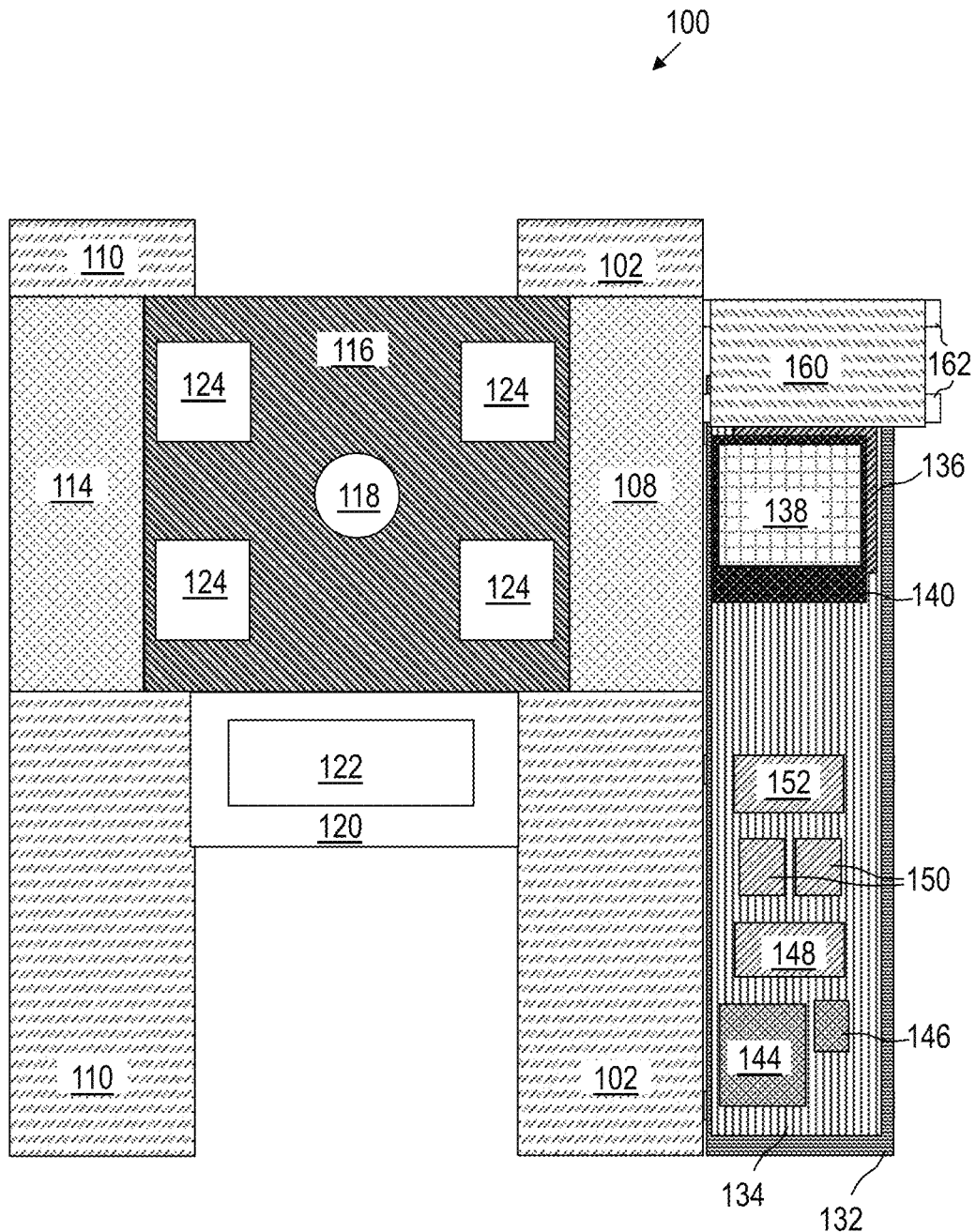
FIG. 2 is a schematic view of at least a portion of an example implementation of apparatus according to one or more aspects of the present disclosure.

FIGS. 1 and 2 are respective schematic views of at least a portion of a simplified, example implementation of a well construction apparatus 100 according to one or more aspects of the present disclosure. The well construction apparatus 100 is an example implementation of a central package of a walking land drilling rig according to one or more aspects of the present disclosure. FIGS. 1 and 2 illustrate different schematic views of the well construction apparatus 100 and will be described together. Each of these figures includes an approximate orientation point O with X-Y-Z coordinate axes to facilitate orienting the different views. FIGS. 1 and 2 illustrate the well construction apparatus 100 where, after at least some modules have been deployed, a portion of the well construction apparatus 100 is raised. Examples of deployment and raising of a portion of the well construction apparatus 100 are described below.

The well construction apparatus 100 in this example may be deployed to a wellsite as separate modules, each of which may be transported to the wellsite by a separate vehicle (e.g., a truck and trailer). The various modules may be arranged at the wellsite and mechanically attached together as appropriate. Various ones of example modules are described below with respect to the well construction apparatus 100, and other implementations may have fewer, additional, and/or different modules.

The well construction apparatus 100 includes two side box modules, a center (or rig floor) module, a drawworks module, a mast module, a driller control room module, and a local electrical room module. In the deployment of these modules at the wellsite (e.g., rig up), the side box modules are arranged in parallel at the wellsite. A first side box module includes a first footing structure 102, first moveable support structures 104, a hydraulic lift 106, and a first rig floor frame 108. A second side box module includes a second footing structure 110, second moveable support structures (not specifically illustrated), a hydraulic lift (not specifically illustrated), and a second rig floor frame 114. The first and second side box modules together form at least a portion of a substructure of the well construction apparatus 100. As initially deployed, the first and second side box modules are collapsed, and, as will become apparent from subsequent description, the first and second side box modules include a hydraulics system (e.g., including the hydraulic lift 106) that raises a rig floor of the well construction apparatus 100. When the hydraulics system is operated, the first moveable support structures 104 and the second moveable support structures can rotate around respective hinge points in the first footing structure 102 and first rig floor frame 108, and in the second footing structure 110 and second rig floor frame 114 to expand the first and second side box modules and raise the rig floor of the well construction apparatus 100.

Additionally, the first footing structure 102 and the second footing structure 110 each include two hydraulically controlled feet 103. In other examples, more hydraulically controlled feet may be used. The feet 103 can be controlled to move (e.g., "walk") the well construction apparatus 100 to and from different locations at the wellsite, e.g., after the well construction apparatus 100 has been fully deployed. The well construction apparatus 100 also includes a hydraulics system that controls the operations of the feet 103.

With the first and second side box modules deployed in parallel at the wellsite, the center module is deployed between the first and second side box modules. The center module is attached to the first rig floor frame 108 and the second rig floor frame 114. The center module includes a rig floor frame that further forms at least a portion of the substructure of the well construction apparatus 100 and includes a rig floor 116. The first rig floor frame 108, the second rig floor frame 114, and the rig floor 116 form a rig floor structure. Additionally, an opening 118 is through the rig floor 116. During some operations of the well construction apparatus 100 such as drilling, a drillstring or other tubulars may extend through the opening 118 to a formation in the underlying earth.

The drawworks module is deployed attached to the center module and/or the first and second side box modules. The drawworks module includes a drawworks skid 120 that is attached to the center module (e.g., the rig floor 116 and/or rig floor frame) and/or to the first rig floor frame 108 and second rig floor frame 114. A drawworks 122, which may be used for, among other things, raising and lowering a drillstring during drilling operations, is mounted on the drawworks skid 120.

The mast module is deployed on the rig floor 116. In this example, the mast module includes a mast 124 (a portion of which is shown in the figures), which may be telescopic. From a vehicle on which the mast module is transported, the mast module is attached to the rig floor 116 at one or more anchor points and is rotated around the anchor point(s) to an upright position. A hydraulics system may be used to rotate the mast 124 into the upright position. The mast 124 may then be telescopically extended to a mast height. A crown block (i.e., a sheaves cluster) may be at and supported by an upper portion of the mast 124.

The mast module further includes a top drive (not illustrated) with associated rotary motor, gear box or transmission, drive shaft, and swivel. A hook and traveling block may be mechanically coupled to the top drive. The top drive may have a rail guide system on the mast 124 that guides the top drive along vertical movement during drilling operations and prevents the top drive from rotating as a result of torque that the top drive applies to a drillstring during drilling operations. The top drive may be secured in the mast 124 during transport and rig up until the top drive is supported by a drill line as described below.

The local electrical room module is deployed adjacent the first side box module. The first footing structure 102 of the first side box module includes support beams 130 that support the local electrical room module during deployment of the local electrical room module. The support beams 130 may be hinged at the first footing structure 102. During transport of the first side box module, the support beams 130 may be folded, by operation of the hinge, to the first footing structure 102. In preparation of deployment and during deployment of the local electrical room module, the support beams 130 may be unfolded to extend perpendicularly, for example, from the first footing structure 102 and may support the local electrical room module. By having the support beams 130 extending from the first footing structure 102 and supporting the local electrical room module, the well construction apparatus 100 may be repositioned without having to separately reposition the local electrical room module during a rig walk operation, for example.

A skid support 132 may be used to further support the local electrical room module. The skid support 132 can be a rigid frame, for example, separate from the local electrical room module. The skid support 132 can be placed on the support beams 130 prior to skidding of the local electrical room module. The skid support 132 can facilitate skidding the local electrical room module on the support beams 130.

The local electrical room module includes a skid 134 that supports various other components of the local electrical room module. The skid 134 and the components mounted thereon can be unloaded from a vehicle (e.g., a trailer) by a pulley system that forces the skid 134 from the vehicle and onto the skid support 132, where the skid 134 is then slid into position on the skid support 132.

A lower electrical room 136 is mounted on the skid 134. The lower electrical room 136 can include various electrical components, such as for control (such as programmable logic controllers (PLCs)), communication, and/or others. Some components that can be included in some examples are described in further detail below.

A raisable apparatus 138 is mounted on a horizontal floor 140, which is attached to and supported by a boom 142. The raisable apparatus 138 can be or comprise various components. For example, the raisable apparatus 138 may include plugs to which one or more cables on the rig floor can be connected. The plugs from the raisable apparatus 138 may be grouped in one or more plug panels. The cables can then extend from the raisable apparatus 138 along and supported at least in part by the boom 142 to, e.g., the lower electrical room 136. The horizontal floor 140 is attached to the boom 142 by a joint, hinge, or the like, for example, at one end of the boom 142. The boom 142 is attached to and supported by the skid 134 by a joint, hinge, or the like, for example, at the other end of the boom 142, which may permit rotation of the boom 142 around the joint, hinge or the like. During transport, the horizontal floor 140 and boom 142 are collapsed or folded (e.g., in a "Z" configuration with the skid 134). In some examples, various mechanism may be present to prevent the horizontal floor 140 and boom 142 from collapsing or folding fully to the skid 134, such as blocks, stops, pins, and/or other example mechanisms. Hence, in some examples, the boom 142 is rigid enough to support the horizontal floor 140 and raisable apparatus 138, e.g., during transport. In some examples, the horizontal floor 140 and boom 142 may collapse or fold fully to the skid 134. In some other examples, the boom 142 may adjust in length such that the floor 140 is aligned with respect to a predetermined reference level associated with the rig floor 108 or with respect to the driller control room 160. At deployment, the horizontal floor 140 can be mechanically coupled to the first rig floor frame 108, for example. In some examples, the horizontal floor 140 is mechanically coupled to the first rig floor frame 108 via a rigid link and pins, for example. In other examples, the horizontal floor 140 can be directly and/or indirectly mechanically coupled to the first rig floor frame 108 via other mechanisms. During deployment, by mechanically coupling the horizontal floor 140 to the first rig floor frame 108, the first rig floor frame 108, e.g., and with the boom 142, can support the horizontal floor 140 and the raisable apparatus 138.

In the illustrated example, a power cable spool 144 is mounted on the skid 134. The power cable spool 144 can reel in and release a medium or high-voltage power cable, which may extend to a stationary location at the wellsite that may include a generator (or set of generators) and/or a power control room. The power cable may be operable to transmit electrical current at about 4,160 volts (V) or other voltages ranging, for example, between about 1.0 kilovolts (kV) and about 100 kV. The power cable may also be a thick gauge cable with one or more conductors, in some examples. Additional details of the power cable and power cable spool 144 are described below in further examples.

A communication cable spool 146 is also mounted on the skid 134. The communication cable spool 146 can wind and unwind a communication cable, which may be from a control room. The communication cable may include and/or be a fiber optic cable, a thin gauge cable, such as may comprise multiple low voltage wires, or other example cables, in some examples.

One or more transformers 148 and one or more brake resistors 150 (e.g., two brake resistors 150) are mounted on the skid 134. Multiple physical resistors may be electrically coupled in parallel and/or serially to form a brake resistor. Additional details of the transformers 148 and brake resistors 150 are described below. One or more radiators 152 are also mounted on the skid 134. The radiators 152 can be used to cool various components of the local electrical room module, such as by pumping cooling fluid through conduit to the lower electrical room 136 and/or the raisable apparatus 138, for example. In some examples, air cooling may be used to remove heat from the various components, such as by using heat spreaders (e.g., with a heat sink that may include high heat conductance fins), and radiators may be omitted or used in addition to the air cooling in those examples.

The driller control room module is deployed adjacent the first side box module. The first rig floor frame 108 of the first side box module includes support beams 162 that support the driller control room module, e.g., a driller control room 160, during deployment of the driller control room module. The support beams 162 may be hinged at the first rig floor frame 108. During transport of the first side box module, the support beams 162 may be folded, by operation of the hinge, to the first rig floor frame 108. In preparation of deployment and during deployment of the driller control room module, the support beams 162 may be unfolded to extend perpendicularly, for example, from the first rig floor frame 108 and may support the driller control room module. The driller control room 160 may be deployed by, for example, a forklift, crane, or other example equipment capable of lifting and placing the driller control room 160 on the support beams 162. The driller control room module may be deployed before or after deployment of the local electrical room module. The raisable apparatus 138 of the local electrical room module may be proximate the driller control room 160 when the local electrical room module and the driller control room module are deployed. Additionally, the driller control room 160 may have one or more plug panels on one or more walls thereof and that are exteriorly facing. The plug panel(s) of the driller control room 160 may be connected to one or more of the plug panel(s) of the raisable apparatus 138 via one or more cables. Hence, components in the driller control room 160 may be electrically coupled to the local electrical room module.

After deploying the above-described modules, the rig floor 116, the first rig floor frame 108, and the second rig floor frame 114 (e.g., the rig floor structure) of the well construction apparatus 100 are raised to an operational (e.g., drilling) level. The rig floor 116, the first rig floor frame 108, and the second rig floor frame 114, in the illustrated example, are raised via operation of the hydraulics system including the hydraulic lift 106 of the first side box module and the hydraulic lift of the second side box module. The hydraulic lifts can be extended, which cause the first moveable support structures 104 and the second moveable support structures to rotate to an upright, vertical position that, in turn, raises the rig floor 116, the first rig floor frame 108, and the second rig floor frame 114.

With the raising of the first rig floor frame 108, the horizontal floor 140 with the raisable apparatus 138 are also lifted. Since the horizontal floor 140 is mechanically coupled to the first rig floor frame 108, the raising of the first rig floor frame 108 also causes the horizontal floor 140 and raisable apparatus 138 to be raised.

With the rig floor 116, the first rig floor frame 108, and the second rig floor frame 114 raised and the mast 124 extended, a drill line can be reeved from a deadline anchor on the rig floor 116 through sheaves of a traveling block mechanically coupled to the top drive and sheaves of a crown block on the mast 124 to the drawworks 122. By releasing out and reeling in the drill line at the drawworks 122, the top drive can be lowered and raised, respectively, along the mast 124 during drilling operations. The top drive can be operated using a power system, such as described below.

Additional modules and components may be incorporated into the well construction apparatus 100. For example, a catwalk module, including a powered catwalk and tubular racks, and a pipe handling manipulator module can be included in the well construction apparatus 100. Further, a drilling fluid circulation and treatment system module including, for example, a shale shaker, a desander, a desilter, a degasser, a hopper and/or one or more drilling fluid tanks may be included in the well construction apparatus 100 and/or separate from the well construction apparatus 100 at the wellsite.

Even further some components may be implemented at the wellsite separate from the well construction apparatus 100. In some example, power generation and control are at the wellsite separate from (e.g., some distance away from) the well construction apparatus 100, as described below. The power generation may include one or more generators operable to provide electrical power. A power control room (PCR) may control the operation of the power generation and, e.g., provide a protective apparatus in the case of a fault. The well construction apparatus 100 may also be powered from the grid.

Figure 3:
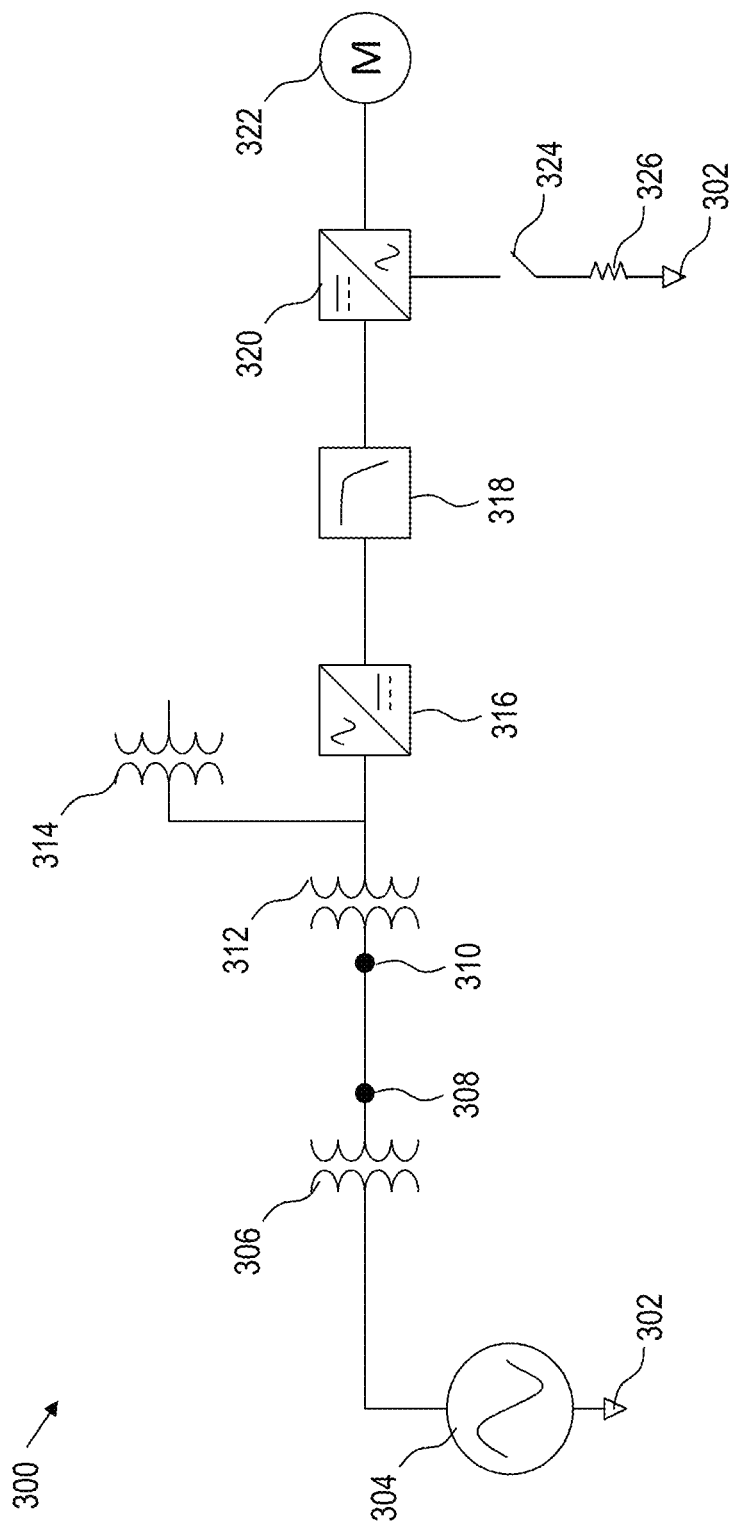
FIG. 3 is a schematic view of at least a portion of an example implementation of apparatus according to one or more aspects of the present disclosure.

FIG. 3 is a schematic view of at least a portion of a simplified, example implementation of a well construction apparatus according to one or more aspects of the present disclosure. FIG. 3 illustrates at least a portion of a one-line schematic of a power system 300 of a well construction apparatus. The power system 300 can include other components that are not illustrated, such as control components like circuit breakers, relays, switches, and others. A person having ordinary skill in the art will readily understand the applicability of such components, which are within the scope of the present disclosure.

The power system 300 includes one or more generators 304 or other power sources, which may be equipped with grounding detection systems. However, the body of the generator 304 may be connected to ground to protect personnel. The generators 304 can include respective prime movers, such as diesel-powered engines, that drive alternators to generate an AC electrical charge. In some examples, the generators 304 generate 600 V at 60 hertz (Hz). The generators 304 are electrically coupled at a node to a primary winding of a transformer 306. The transformer 306 can be at a PCR at a stationary position at the wellsite during operations, for example, and hence, the secondary winding of the transformer 306 can be electrically coupled by a power cable from a connection node 308 at (or near) the power control room to a connection node 310 at the local electrical room module of the well construction apparatus, e.g., at the moveable end of the electrical power cable. However, the generator 304 may be a medium voltage generator, which may not be coupled with the transformer 306. Also, the well construction apparatus 100 may be powered directly from the grid either in medium-voltage or even high-voltage.

The power cable may, during deployment at the wellsite, be at least partially wound on a power cable spool (e.g., power cable spool 144 in FIGS. 1 and 2) and/or at least partially lie on the ground at the wellsite. The transformer 306 can step up a voltage between the primary winding and the secondary winding. In some examples, the transformer 306 steps up the voltage from 600 V to 4,160 V, which can result in a voltage of 4,160 V at the connection nodes 308 and 310. However, it is to be understood that a voltage level within the scope of the present disclosure may range between about 2,400 V and about 13,800 V, or even as high as about 34,500 V.

The connection node 310 is electrically coupled to a primary winding of a transformer 312 on the local electrical room module of the well construction apparatus. The transformer 312 can step down a voltage between the primary winding and the secondary winding. In some examples, the transformer 312 steps down the voltage from 4,160 V to 600 V. However, the well construction apparatus 100 may be powered in medium-voltage.

The secondary winding of the transformer 312 is electrically coupled to a primary winding of a transformer 314. The transformer 314 can further step down a voltage between the primary winding and the secondary winding thereof. The output from the secondary winding of the transformer 314 can be used, e.g., to power various components of the local electrical room module, such as communication devices, PLCs, and/or other example components, that are not specifically illustrated. In some examples, the transformer 312 steps down the voltage from 600 V to 120 V. However, in another implementation of the power system 300, the generators 304 may directly deliver a medium voltage (i.e., 4,160 V) or another predetermined voltage. In such implementations, the transformer 306 may not be included or utilized.

The secondary winding of the transformer 312 is also electrically coupled to an input node of a rectifier 316. The rectifier 316 changes the AC power to DC power. A person of ordinary skill in the art will readily understand different configurations useable for the rectifier 316, which are within the scope of the present disclosure. In some examples, the rectifier 316 changes the power from 600 V AC to 800 V DC at an output node of the rectifier 316. The rectifier 316 may be a 6-pulse, 12-pulse, or even a 24-pulse rectifier operable to reduce harmonics. The step down transformer 312 may have multiple secondary windings to create the intended number of phases.

The output node of the rectifier 316 is electrically coupled to an input node of a filter 318, such as a low pass filter. By passing the output of the rectifier 316 through the filter 318, any ripples and/or noise in the power signal can be reduced and/or removed. Hence, the output of the filter 318 can be a DC power signal with reduced ripples and/or noise compared to the output of the rectifier 316. However, when a 12- or 24-pulse rectifier is used, the output filter 318 can be removed.

The output node of the filter 318 is electrically coupled to an input node of an inverter 320. The inverter 320 changes the DC power to AC power and permits control and varying of the frequency of the output AC power. A person of ordinary skill in the art will readily understand different configurations useable for the inverter 320, which are within the scope of the present disclosure.

The output node of the inverter 320 is electrically coupled to a top drive motor 322. The top drive motor 322, in this example, is an asynchronous induction motor (e.g., a three-phase squirrel-cage motor) that operates with a torque and speed, e.g., for rotating a drillstring, that is controllable by the frequency of the power, e.g., the output of the inverter 320. A person of ordinary skill in the art will readily understand variable frequency drive (VFD) principles for controlling the top drive motor 322, which are within the scope of the present disclosure.

A chopper 324 and brake resistor 326 are serially electrically coupled between the inverter 320 and ground 302. Under some operating conditions, the top drive motor 322 may generate rather than consume power, such as when the top drive motor 322 begins to freely rotate at too great of a speed. In such situations, the chopper 324 is controlled to close and open, such as by a PLC and based on a pulse-width-modulated signal, to divert power to the brake resistor 326, which dissipates the power. However, the braking power may be regenerated back to the power system or the grid, such as by using a controlled rectifier (e.g., a silicon-controlled rectifier (SCR), an insulated-gate bipolar transistor (IGBT) rectifier, etc.).

Although discussed singularly, various components described in the power system 300 may comprise multiple components in parallel (e.g., two inverters 320 electrically coupled together in parallel) or combinations of multiple components in parallel. A person having ordinary skill the art will readily understand such a modification, which is within the scope of the present disclosure.

Although not specifically illustrated, similar components, such as one or more of a rectifier, a filter, an inverter, chopper, brake resistor, and induction motor, can be included in the power system 300 for the drawworks module, for example. For example, a rectifier, a filter, an inverter, chopper, brake resistor, and induction motor of the drawworks can be electrically coupled the same as respective components in FIG. 3 from the transformer 312 for the motor of the top drive. A person having ordinary skill in the art will readily understand the applicability of such components, which is within the scope of the present disclosure.

As introduced herein, a power cable spool is mounted in a local electrical room module of a well construction apparatus, which may be moveable, e.g., by walking, to reel and unreel a power cable, such as a 4,160 V power cable, that is connected to a stationary generator set and/or power control room at the wellsite. By reeling and unreeling the power cable at the well construction apparatus, the cable may be less susceptible to abrasion and damage compared to a non-reeled electrical power cable or an electrical power cable reeled on the stationary side.

In some examples, operations of the well construction apparatus can be powered by a three-phase AC power utilized by operations of the well construction apparatus in these examples, the well construction apparatus can consume a current level from about 1,200 to 4,000 amperes (A) when operating at 600 V AC. If power is conducted at 600 V AC from the one or more generators to the well construction apparatus, multiple conductors and/or conductors with a large cross-sectional area might be used to avoid overheating of the conductors and/or to avoid a substantial voltage drop (by reducing a current density through the conductors), such as between the generators (and/or power control room) and the well construction apparatus, which may have a separation distance of up to 150 meters, for example. To support such power levels at a wellsite in a more practical manner, a transformer may be provided at the stationary location (e.g., proximate the generators and/or power control room) and at the well construction apparatus (e.g., as part of the local electrical room module) with a three-phase power distribution cable therebetween. The transformer at the stationary location may increase the voltage from about 600 V to 4,160 V, which proportionately reduces the current level through the power cable between the stationary location and the well construction apparatus. The resulting current level is reduced to about 200 to 500 A, for example. Different voltages and/or currents can be used or achieved in other example implementations.

The power cable can be reeled onto a rotatable spool that is carried with and affixed to the local electrical room module deployed as part of the well construction apparatus, such as the power cable spool 144 in FIGS. 1 and 2. The power cable can be wound or unwound when the well construction apparatus is moved, such as between wellbores. By positioning the power cable spool on the local electrical room module of the well construction apparatus, chafing and other abrasion of the insulation on the power cable may be reduced when the well construction apparatus is repositioned, such as between wellbores.

Figure 4A:
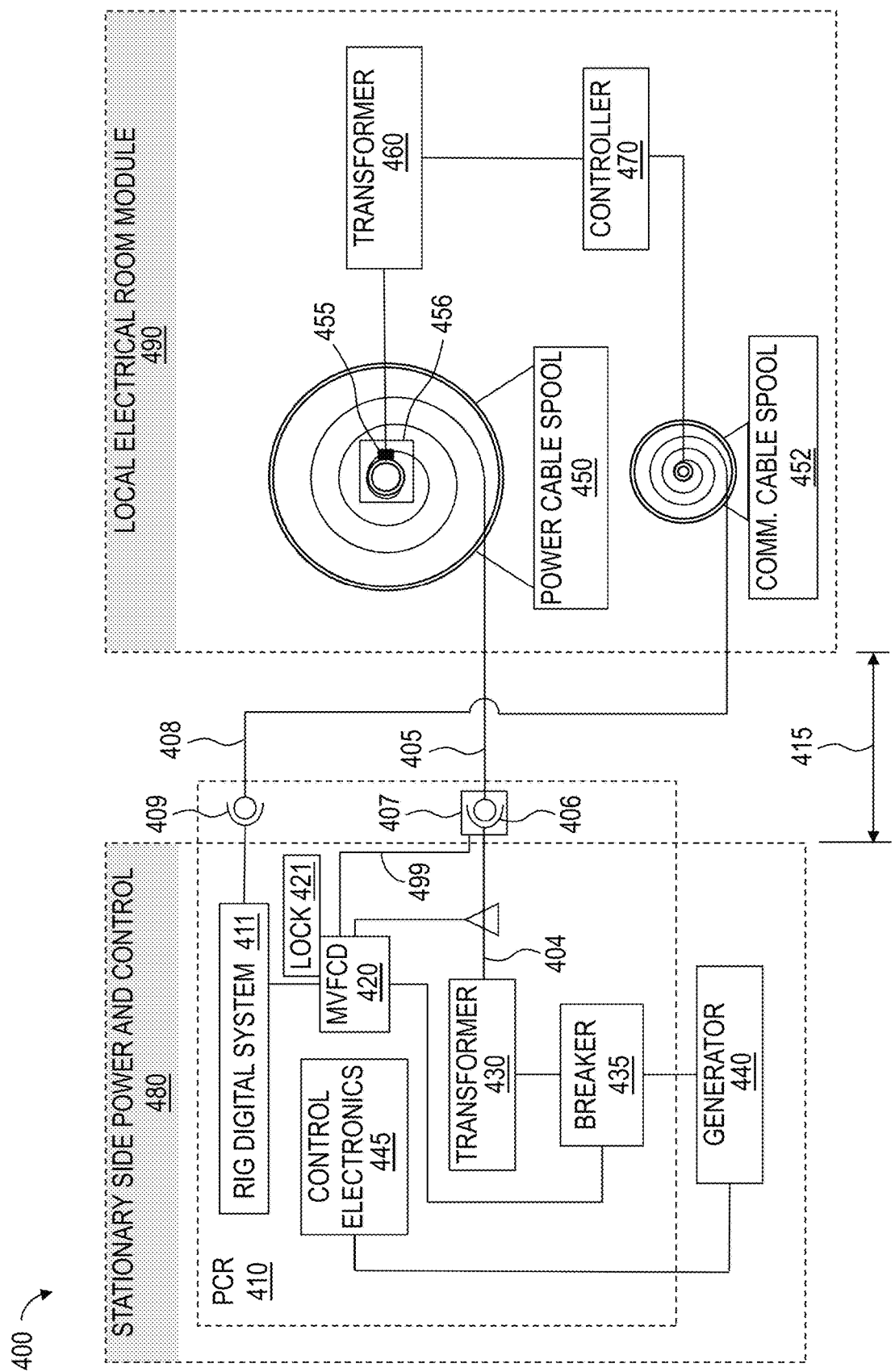
FIG. 4A is a schematic view of at least a portion of an example implementation of apparatus according to one or more aspects of the present disclosure.

FIG. 4A is a schematic view of at least a portion of a power distribution system 400 at a wellsite for a well construction apparatus, which is capable of moving, e.g., by "walking", according to one or more aspects of the present disclosure. The power distribution system 400 of FIG. 4A can implement at least a portion of the power system 300 of FIG. 3, for example.

The power distribution system 400 includes a stationary side power and control apparatus 480 at the well site and a local electrical room module (LER) 490 of the well construction apparatus at the wellsite. At the stationary side 480, one or more generators 440 (e.g., generators 304 in FIG. 3) that produce a three-phase AC voltage, such as 600 V AC, are coupled to a transformer 430 (e.g., transformer 306 in FIG. 3) that steps up the AC voltage, such as to 4,160 V. One or more power breakers 435 are installed between the generator 440 and the transformer 430. A medium-voltage fault circuit detector (MVFCD) 420 monitors power cables on the medium voltage side. Upon detecting one or more faults, the MVFCD 420 forces the breaker 435 to open, stopping the application of medium voltage to a medium-voltage power cable 405 extending between the stationary side 480 and the LER 490. The MVFCD 420 associated with the breaker 435 may be referred to herein as a medium-voltage fault circuit interrupter (MVFCI). A PCR 410 may include components (e.g., PLCs) that control and/or protect the generator 440 and transformer 430, for example. Additionally, the PCR 410 may include control electronics 445 and/or other components that control and/or facilitate bringing one or more of the generators 440 online in the power distribution system 400, such as by monitoring the voltage, phase, and/or frequency of the power generated by the one or more generators 440 relative to power being distributed by the power distribution system 400. Further, the MVFCD 420 may include components that detect ground faults proximate the transformer 430, such as on an output node of the transformer 430. If a fault is detected by a ground fault circuit detector (GFCD) of the MVFCD 420, the MVFCD 420 can control components, such as one or more circuit breakers 435 and/or switches, to isolate the fault and/or remove, e.g., the transformer 430 from the fault.

Electrical power may be transmitted from the stationary side 480 generator 440 to the LER 490 of the walking rig (i.e., central package) during the walking operations, such as to supply the electrical power to the walking rig to perform such walking operations. Thus, the well construction apparatus may utilize power management of electrical power received from the stationary side 480 to perform the walking operations and may not include or otherwise utilize an electrical generator located on the walking rig to perform the walking operations.

The medium-voltage power cable 405 may be equipped with at least a portion of a connector assembly 406 operable to electrically connect the cable 405 with the transformer 430. The connector assembly 406 may be contained in an enclosure or protection box 407 at the PCR 410. The protection box 407 comprises a door or lid (not shown) that may be opened to permit access to the connector assembly 406, such as to disconnect the connector assembly 406.

Figure 4B:
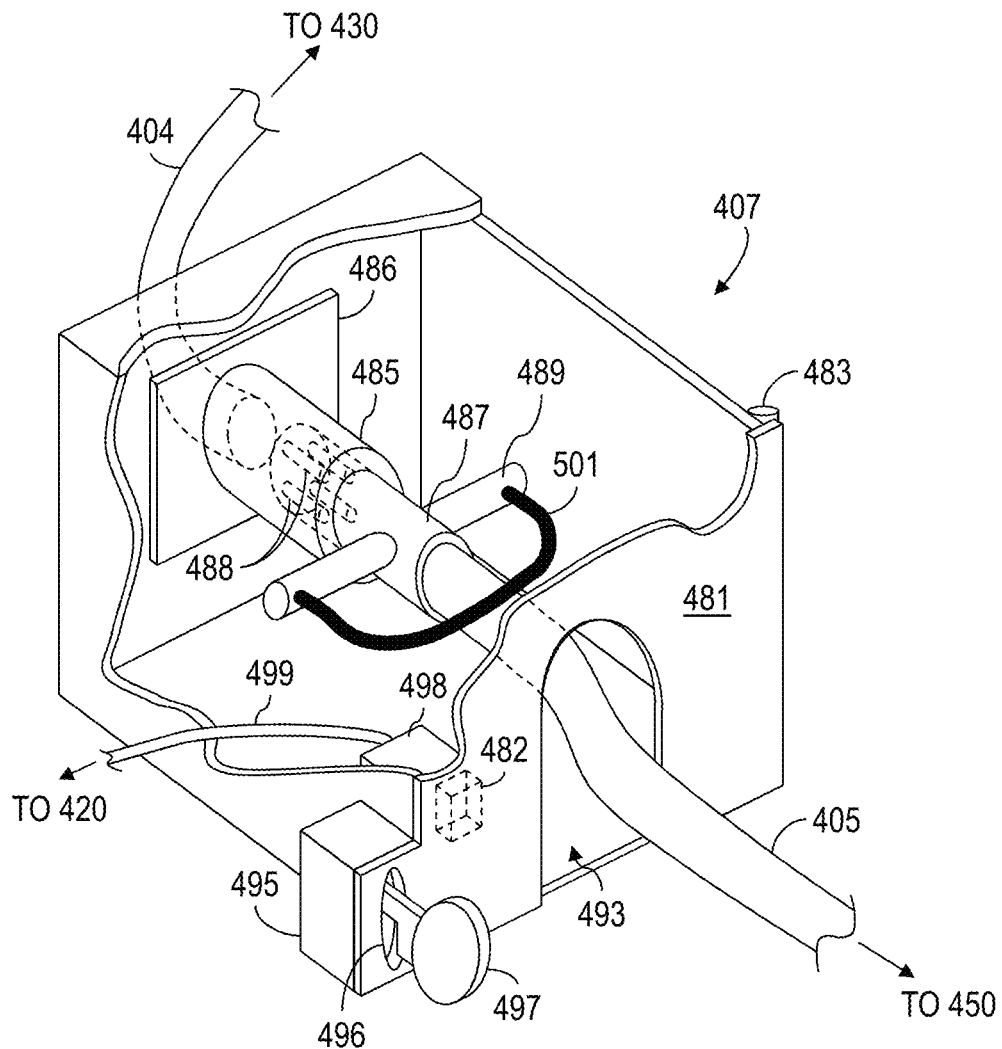
FIG. 4B is a schematic view of at least a portion of an example implementation of apparatus according to one or more aspects of the present disclosure.

At least a portion of an example implementation of the protection box 407 is schematically shown in FIG. 4B. The cable 405 is equipped with male connectors 487 supporting electrical male pins 488. The male connector 487 connects into a female connector 485 that includes female sockets (not shown) that receive and connect to the electrical pins 488. The female connector 485 may be attached inside the box 407 by a flange 486 of the female connector 485. The cable 404 extends between and electrically interconnects the female connector 485 and the transformer 430 (shown in FIG. 4A). The male connector 487 terminates the cable 405 delivered by the spool 450 (shown in FIG. 4A). The male connector 487 may be equipped with a bulge or radial extension 489, which may support a handle 501. The connection between the male connector 487 and the female connector 485 is inside the protection box 407. Thus, the protection box 407 may protect the connection between the cables 404 and 405 via the male connector 487 and the female connector 485.

As described above, the protection box 407 may be equipped with a lid 481. The lid 481 may be equipped with hinges 483 allowing the rotation of the lid 481. The lid 481 has a slot 493 through which the cable 405 passes into the protection box 407. However, the slot 493 may not permit the passage of the bulge or radial extension 489 and the handle 501, thus imposing the opening of the lid 481 to perform the connection or disconnection of the male connector 487 and female connector 485. The lid 481 may be equipped with a switch 498 which can change of status (open-close) with the movement of the lid 481.

It is noted that the implementations of the example protection box 407 depicted in FIG. 4B and others within the scope of the present disclosure may also be utilized for the herein-described protection and/or other functions of items other than the connector 485/487 depicted in FIG. 4B. Such other items may include other types of electrical connectors, electrical connections, and/or other electrical devices within the scope of the present disclosure.

Figure 4C:
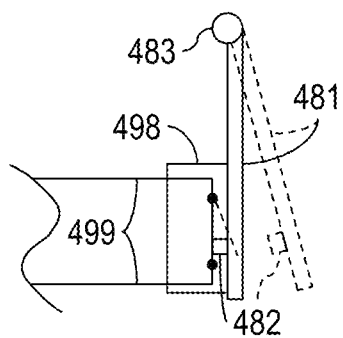
FIG. 4C is a schematic view of at least a portion of an example implementation of apparatus according to one or more aspects of the present disclosure.

FIG. 4C schematically depicts an example implementation of the switch 498. The lid 481 may be equipped with an internally extending or other extension 482 that can force the switch 498 to change status. A cable 499 may connect the switch 498 to the MVFCD 420. Thus, the status of the switch may permit control of the status of the power breaker 435, so that the breaker 435 can only be closed to feed power to the cable 405 only if the lid 481 is closed. Furthermore, a lock 495 may lock the lid 481 in the closed position. A key 497 may operate the lock 495 to prohibit the opening of the lid 481. The key 497 can be removed from the key slot 496 only after locking the lid 481 closed. The MVFCD system may also be equipped with a lock system 421 that can only be activated by the key 497 of the box 407. With such system, the MVFCD can activate the breaker 435 only when the key is present on the lock system 421. With such system, the power can be transmitted through the connector 406 only when the lid 481 is closed and locked, and also when the key 497 has been installed on the lock system 421 of the MVFCD 420.

It should be noted that the lid 481 may be locked by a pin (not shown) which may be installed to block the opening of the lid 418. The key 497 may not be able to be removed unless the pin is blocking the lid, so that the key can then move to the lock 421 to allow the activation of the breaker 435 via the MVFCD 420.

Furthermore, the proper connections of the connector 406 (or multiple connections of multiple connectors 406 in series) may be determined by the example analog method described below with reference to FIG. 4D (with continued reference to FIGS. 4A, 4B, and 4C). As described above, the connection at the connector 406 involves the male connector 487 and the female connector 485. In the example implementation depicted in FIG. 4D, three phases A, B, and C transmit power via corresponding insulated wires 360 (of the cable 404 and the female connector 485) and insulated wires 361 (of the cable 405 and the male connector 487). A main ground path G is depicted as an unshielded wire 362 (of the cable 404 and the female connector 485) and an unshielded wire 363 (of the cable 405 and the male connector 487). Two additional conductive paths C1 and C2 are depicted by corresponding insulated wires 364 and 366 (of the cable 404 and the female connector 485) and insulated wires 365 and 366 (of the cable 405 and the male connector 487).

The MVFCD 420 may monitor the proper connection of the connector assembly 406 via impedance measurement M1 and M2 performed by the MVFCD 420. M2 is the measured impedance placed between C1 and C2 based on the detection of the impedance (resistance) between C1 and C2, such as at 351 and 352 depicted in FIG. 4D. The multiple impedances 351 and 352 (and others (not shown) if more connectors are utilized) are mounted in parallel. With such measurement system, the MVFCD 420 can determine the number of connections (i.e., of the connector assembly 406) made along the cable 404/405 up to the receiving transformer 460. If M2 is high (or close to infinity), the first connection (close to the transmitting transformer 430) is open (not connected). If M2 is very low, a short circuit may be present along the cable 405. When proper connection(s) is achieved between the transformer 430 and 450, M2 corresponds to the theoretical value corresponding to this set of impedances (resistors) in parallel (with some acceptable range of value variation). In that case, the MVFCD 420 closes the breaker 435 so that power may be transmitted from the transformer 430 to the transformer 460. A similar measurement M1 may be performed by the MVFCD 420 to detect the impedance (resistance) placed between C1 and G, such as at 353 and 354 depicted in FIG. 4D. If M1 is high (or close to infinity), the first connection (close to the transmitting transformer 430) is open (not connected). If M1 is very low, a short circuit may be present along the cable 405. When the proper connection(s) is achieved between the transformer 430 and 450, M1 corresponds to the theoretical value corresponding to this set of impedances (resistors) in parallel (with some acceptable range of value variation). In that case, the MVFCD 420 closes the breaker 435 so that power may be transmitted from the transformer 430 to the transformer 460.

Furthermore, the lengths of the pins 488 of the male connector 487 may be relatively different. For example, as depicted in the example implementation shown in FIG. 4D, the pins 370 for the three phases A, B, and C (which may have the same length) may be shorter than the pin 371 for the ground connection G so that the ground is already connected when the phases are connected to ensure proper protection in case of a faulty cable, so that leaked current may return to the power source. The pins 372 of C1 and C2 are shorter in comparison to the other pins 370 and 371 so as to avoid their connection until after the connections for ground G and the power transmission phases A, B, and C are established. This ensures that the MVFCD 420 will activate the breaker 435 for power transmission only when the connection 406 is already made, but the MVFCD 420 will also deactivate the breaker 435 as soon as the connection 406 may start to be disengaged.

Figure 4D:
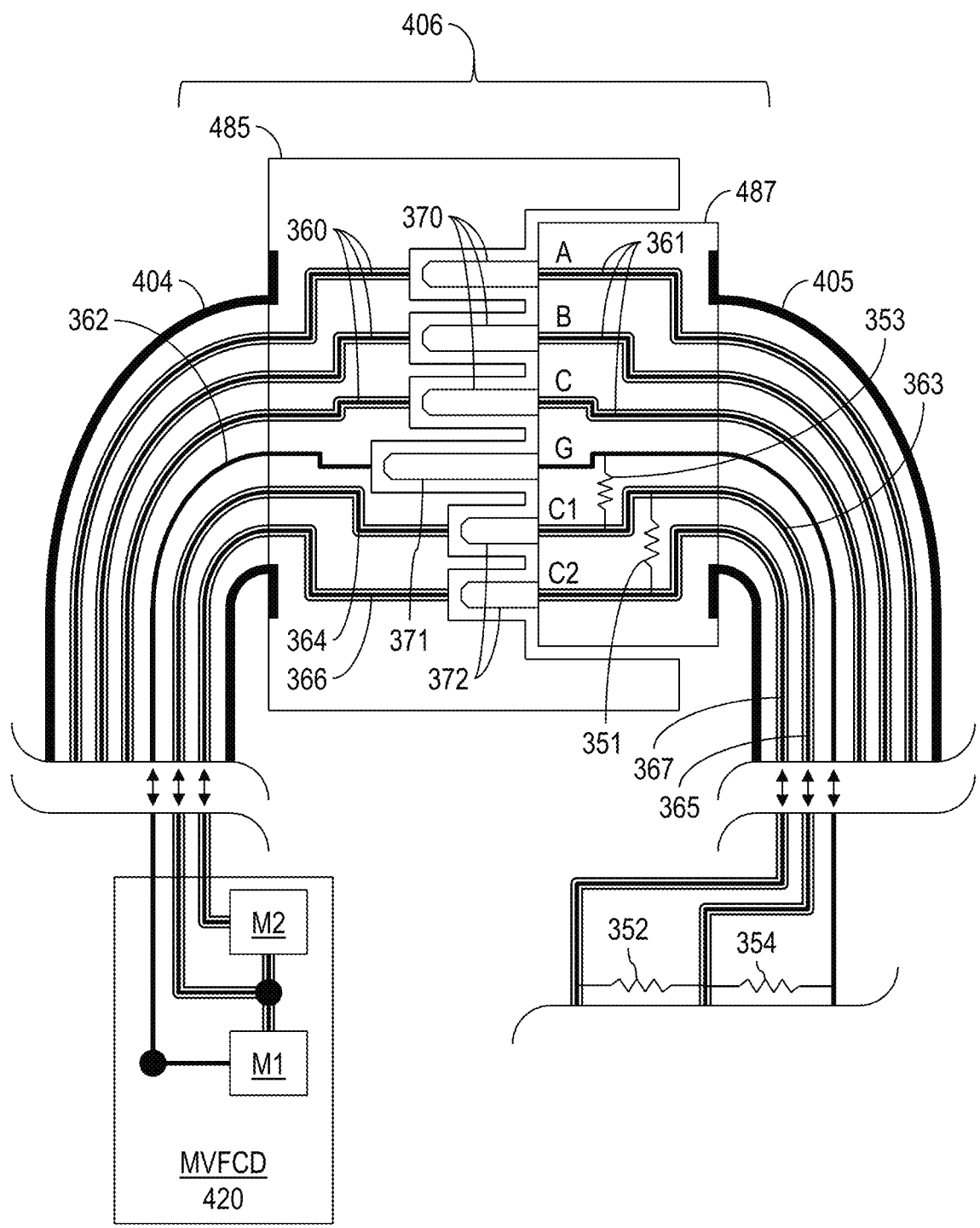
FIG. 4D is a schematic view of at least a portion of an example implementation of apparatus according to one or more aspects of the present disclosure.

It should be noted that in some implementations, just one impedance may be installed for monitoring, such as after the connector assembly 406 and cable 405 (or most of the length of the cable 405), such as at 352 and 354 shown in FIG. 4D. In addition, this resistance may be a short circuit. Such implementations may limit the capability of problem detection, but may still be able to determine the overall validity of the interconnections between the transformers 430 and 460.

It some implementations, the measurements M1 and M2 may be performed at the moveable well construction apparatus (e.g., at the LER module 490). In such implementations, the measurements may be transmitted to the MVFCD 420 via the communication cable 408, whether via analog or digital means. When such transmissions are digital, the controller 470 may control the measurements M1 and M2 and transmit the data to the rig digital system 411, which in turn may transmit the information about the status of the power transmission system to the MVFCD 420.

The power cable 405 is adapted to conduct AC power from the stationary side 480 (e.g., from the transformer 430 and/or PCR 410) over a variable distance 415 to the LER 490 of the well construction apparatus. A power cable spool 450 is mounted on the LER 490, such as illustrated in and described with respect to FIGS. 1 and 2. The cable spool 450 is capable of reeling in and out and at least partially supporting the power cable 405. The power cable 405, as terminated at the cable spool 450, is electrically coupled to a transformer 460 (e.g., transformer 310 in FIG. 3) that is located at the LER 490 and operable to step down the voltage supplied from the power cable 405, such as to 600 V AC. The lower voltage, e.g., 600 V AC, may be supplied as a power source voltage to controller 470 of the well construction apparatus, such as for a top drive, drawworks, and/or other components and equipment.

The power cable spool 450 is equipped with a slip-ring system 455 to permit sliding rotary contact for wires inside the power cable 405. The slip-ring system 455 may be contained in an enclosure or protection box 456. The protection box 456 may comprise an access door or lid (not shown) that may be opened to access the slip-ring system 455, such as to perform inspection and/or maintenance. The slip-ring system 455 may be considered as an additional connection along the power transmission to the transformer 460. The detection methods described above may apply to such additional connection.

The PCR 410 may further include a rig digital system 411 communicatively connected with the MVFCD 420 and with the controller 470 of the LER 490 via a communication cable 408 extending between the stationary side 480 and the LER 490. The communication cable 408 may be connected with the PCR 410 via a connector assembly 409 at the PCR 410. The communication cable 408 may be stored on a reel 452, such as may permit the communication cable 408 to extend over the variable distance 415 as the LER 490 moves away from the stationary side 480 (i.e., when the walking rig moves).

Spooling and unspooling of the power and communication cables 405, 408 onto and from the corresponding spools 450, 452 may be coordinated with (and/or ensure coordination of) the rig during walking operations, including rig movement in two perpendicular or otherwise different directions (e.g., in a first direction parallel to a North-South direction and a second direction parallel to a East-West direction). For example, the spooling and unspooling operations may be synchronized with the movement of the rig, such as to reduce or minimize axial loads (e.g., compression, tension) imparted to the cables 405, 408, permitting the rig to move (perhaps omnidirectionally) along the ground/wellsite pad.

When operating a medium-voltage power distribution system (e.g., the power distribution system 400), access to bare electrical components and connector assemblies (e.g., the connector assembly 406) may be limited when power is present, and multiple levels of protection may be implemented. For example, a locking handle (not shown) may be installed in association with the medium-voltage connector assembly 406. Such locking handle may utilize a lock and key assembly (i.e., an access interlock) mounted to or otherwise operatively connected in association with the connector assembly 406 in the PCR 410. The lock and key assembly may permit operation of the locking handle to disconnect the connector assembly 406 when the key is inserted. Furthermore, the connector assembly 406 may have to be properly engaged to permit the locking handle to be locked and the key to be removed from the lock. Thus, the lock and key assembly assures proper engagement of the connector assembly 406 to permit the MVFCD 420 to activate the breaker 435 and permit power to be fed to the primary side of the medium-voltage transformer 430.

As another example, the lid of the protection box 407 may be equipped with a switch (not shown) to automatically detect the status of the lid. The switch may be communicatively connected to the MVFCD 420 and cause the MVFCD 420 to open the breaker 435 when the lid is open.

In another example, two pins (not shown) of the connector assembly 406 may be utilized to determine proper connection of the medium-voltage power cable 405. On the PCR side of the connector assembly 406, the pins may be monitored by the MVFCD 420 to determine a "detected" impedance (i.e., resistance). When the connector assembly 406 is properly engaged, the pins are shorted within a shell of the connector assembly 406 and the MVFCD determines that the connection is proper when the detected impedance is low. Then, the MVFCD 420 permits the breaker 435 to feed power to the transformer 430.

Another example pertains to the transformers 430, 460 on both extremities of the medium-voltage power cable 405 being three-phase transformers electrically connected in a "Y" configuration. The power cable 405 may comprise four conductors (three for the electrical phases and one for the "earth"). At the PCR 410, the isolation between the center of the Y connection and the earth may be monitored. If one or more phases of the cable 405 is not properly isolated from the earth, a current leakage may be established. Such current may be limited by a resistor 511 (shown in FIGS. 5 and 7) of the detection system. A measurement of the default current may be fed into the MVFCD 420, and if the default current is above a defined threshold, the MVFCD may reopen the breaker 435.

The LER 490 may comprise one or more sensors operable to detect electrical faults associated with the power cable 405. If such sensors detect an electrical fault, information generated by the sensors and/or information indicative of the electrical fault may be transmitted by the communication cable 408 from the walking rig to the rig digital system 411 of the PCR 410, which may signal the MVFCD 420 to disconnect the breaker 435 to stop the transfer of electrical power from the stationary equipment to the walking rig. The LER 490 and/or other components may also comprise sensors operable to detect other faults, errors, malfunction, hazardous conditions, and/or other adverse occurrences associated with the rig and/or wellsite equipment. Information generated by such sensors and/or otherwise indicative of the adverse occurrence may be digitally transmitted via the communication cable 408 between the walking rig and the PCR 410 (e.g., to the rig digital system 411), which may digitally signal and/or otherwise be utilized to control rig and/or wellsite equipment in accordant response to the adverse occurrence, such as to open/close one or more electrical, hydraulic, mechanical, and/or other circuits of the rig and/or wellsite equipment, and/or to control one or more valves, switches, and/or actuators of the rig and/or wellsite equipment.

For example, the lid of the protection box 456 may be locked with a lock and key assembly (not shown) to selectively permit and prevent opening of the lid. In such implementations, the key used to open the protection box 456 may have to deactivate the MVFCD 420 before the key can be used to open the protection box 456 and, after locking the protection box 456, the key may then be used to reactivate the MVFCD 420 and, thus, to permit the activation of the breaker 435 to feed power to the primary side of the medium-voltage transformer 430.

The lid of the protection box 456 may also or instead be equipped with a switch (not shown) to automatically detect the status of the lid. The status of the switch may be communicated to the MVFCD 420 via the communication cable 408. Thus, for example, as soon as the lid is opened, the MVFCD 420 may open the breaker 435. Furthermore, if the connector assembly 409 does not properly electrically connect the communication cable 408 with the rig digital system 411, the MVFCD 420 may determine that an anomaly in the lid switch is present, and thus cause the breaker 435 to open.

Although one connector assembly 406 is shown utilized along the medium-voltage power cable 405, additional connector assemblies may be utilized at the LER 490 near the transformer 460. The additional (e.g., two or more) connector assemblies may be utilized, for example, when the LER 490 is located on the rig floor. When utilized, the additional connector assemblies may be monitored similarly to the primary connector assembly 406 (e.g., mechanical lock and key assembly, plug connected verification, closed door on the box, etc.). Such electrical verifications may be facilitated by utilizing a copper pair (and/or other conductor(s)) of the communication cable 408.

Figure 5:
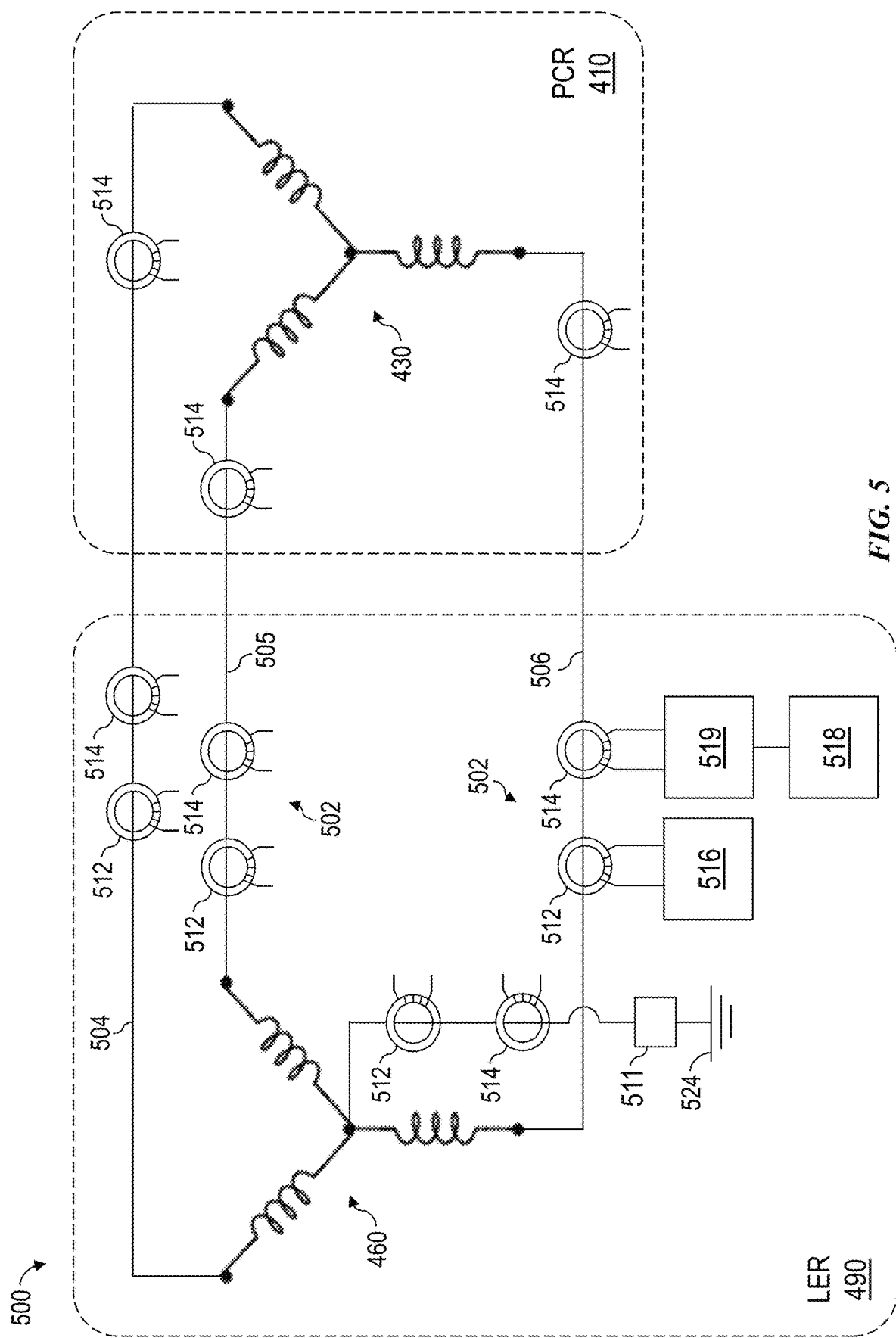
FIG. 5 is a schematic view of at least a portion of an example implementation of apparatus according to one or more aspects of the present disclosure.
Figure 6:
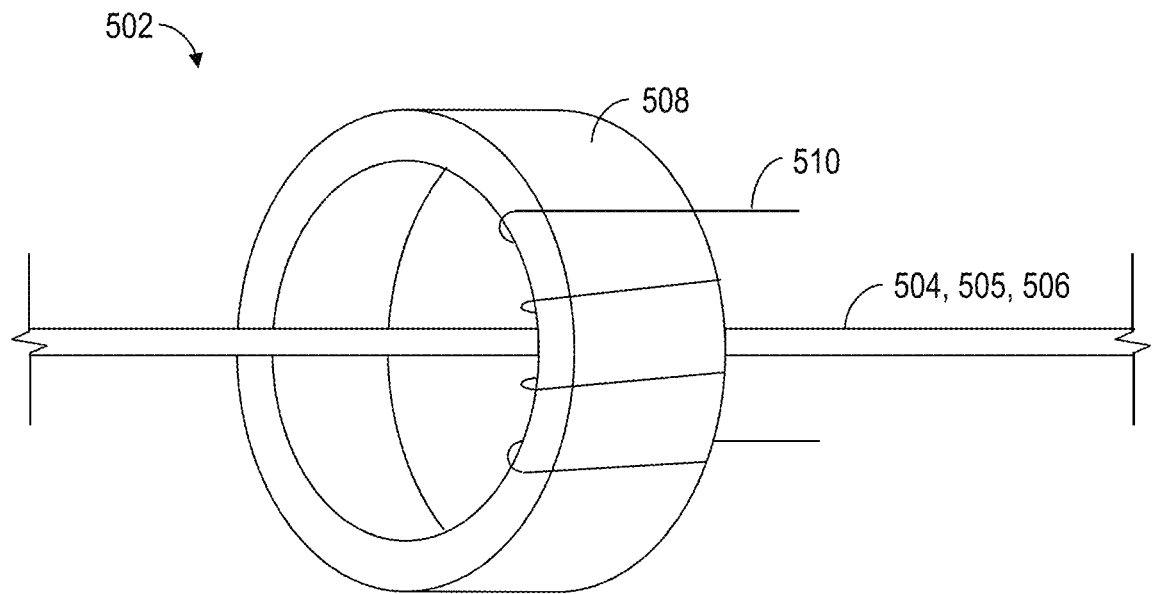
FIG. 6 is an enlarged view of a portion of the apparatus shown in FIG. 5 according to one or more aspects of the present disclosure.

Other fault detection systems may be utilized to insure that the connector assemblies 406 along the medium-voltage power cable 405 are properly engaged. FIG. 5 is a schematic view of at least a portion of a power transmission system 500 of the power distribution system 400 shown in FIG. 4A according to one or more aspects of the present disclosure. FIG. 5 shows several pairs of measurement transformers 502 that may be utilized to monitor each power wire 504, 505, 506 extending between the PCR 410 and the LER 490 according to one or more aspects of the present disclosure. FIG. 6 shows an enlarged view of one of the measurement transformers 502 of toroid form, comprising a "donut" of ferromagnetic material 508 and a sensor wire wound around the ferromagnetic material 508 to form an electromagnetic coil or winding 510. One of the power wires 504, 505, 506 passes through the opening of the ferromagnetic material 508.

As described below, the measurement transformers 502 may operate as electromagnetic transmitters TX 512 and receivers RX 514. The measurement transformers 502 operating as the transmitters TX 512 may be electrically connected with corresponding signal generators 516 (just one shown) operable to inject (i.e., impart) a high frequency signal (e.g., electrical current) into the corresponding winding 510 to create an AC, high-frequency magnetic flux into the ferromagnetic material 508, which in turn injects an AC, high-frequency current into the corresponding power wire 504, 505, 506 if a loop exits for the power wire 504, 505, 506. The measurement transformers 502 operating as the receivers RX 514 may be operable to detect the high frequency current passing through the corresponding power wire 504, 505, 506. The current creates an AC flux in the ferromagnetic material 508 causing a voltage within the sensor winding 510. Each receiver RX 514 may be electrically connected with corresponding signal sensor 518 (just one shown) operable to detect and/or measure the voltage within the sensor winding 510. A signal filter 519 may be electrically connected between each receiver RX 514 and a corresponding signal sensor 518.

Figure 7:
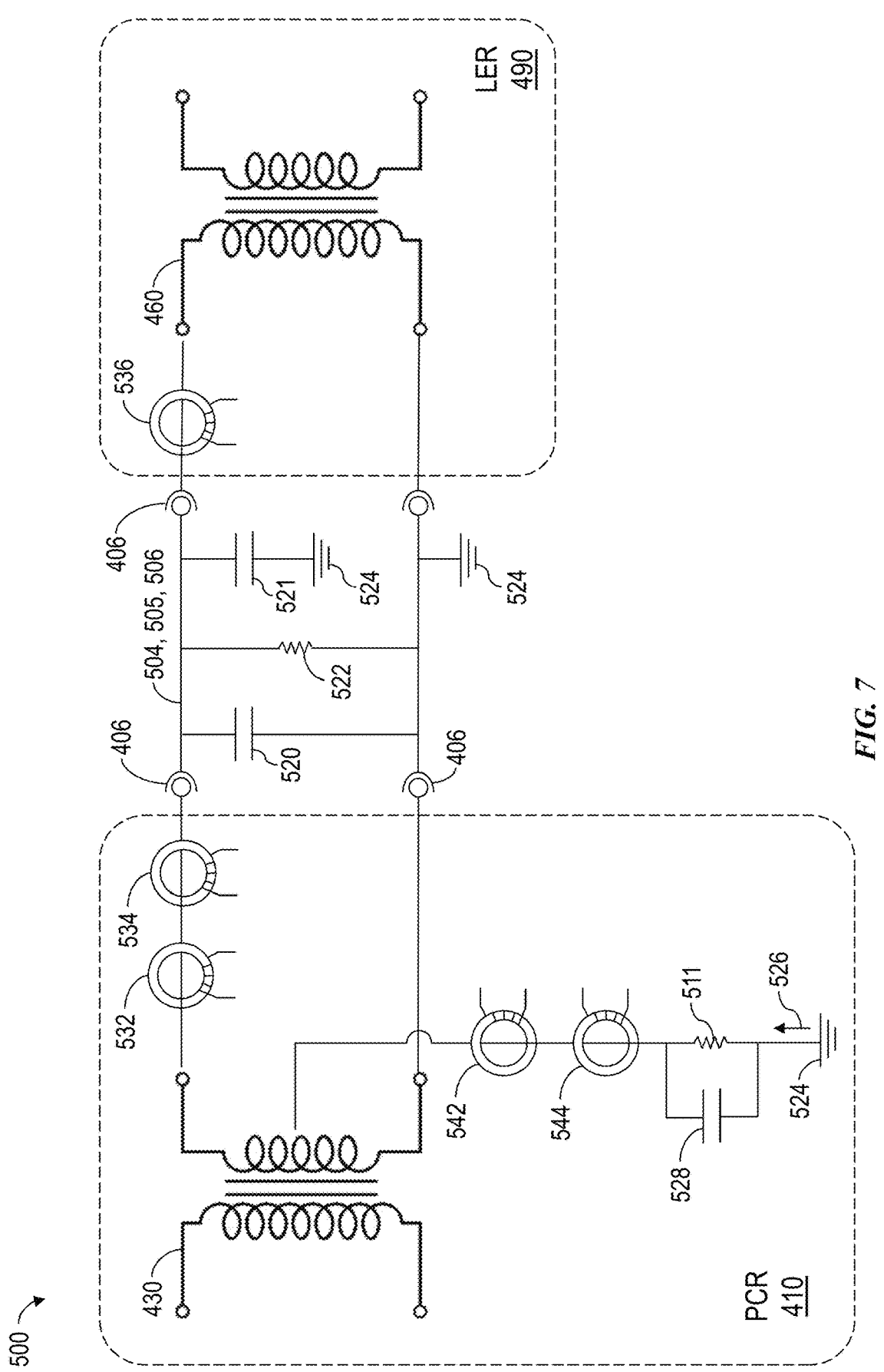
FIG. 7 is a schematic view of at least a portion of an example implementation of apparatus according to one or more aspects of the present disclosure.

FIG. 7 is a schematic view of one of the wires 504, 505, 506 (i.e., one phase) of the Y connections of the power transmission system 500 shown in FIG. 5 according to one or more aspects of the present disclosure. A loop exits via the power wire 504, 505, 506 through the power transformers 430, 460 when the medium-voltage power cable 405 is properly connected (i.e., the connecters assemblies 406 are properly engaged) to the transformers 430, 460. A capacitive coupling $C_C$ 520 between the power wire 504, 505, 506 may affect the impedance detected by each pair of transmitters $TX_L$ 532 and receivers $RX_L$ 534 (where subscript "L" indicates a local TX or RX). At high frequency, the presence of such capacitor $C_C$ 520 reduces the overall high frequency impedance of the power cable 405. The LER 490 may also be equipped with a receiver $RX_R$ 536 (where subscript "R" indicates a remote RX) to monitor the current $I_{HF-R}$ passing through the receiver $RX_R$ 536 (i.e., amount of current $I_{HF-L}$ passing through the receiver $RX_L$ 514 that by-passed the capacitive effect $C_C$ 520 of the power cable 405). The measurement of the current $I_{HF-L}$ through the receiver $RX_R$ 536 permits determination of the total impedance at the PCR 410 end of the power cable 405. This includes the effect of the capacitance $C_C$ 520 and resistance $R_{isolation}$ 522. When the cable 405 is in good condition, then the resistance $R_{isolation}$ 522 is high. However, after sustaining damage, the resistance $R_{isolation}$ 522 may drop drastically. The wire 504, 505, 506 may be grounded 524 via a capacitor $C_{CG}$ 521. Also, the additional measurement performed by the receiver $RX_R$ 536 may permit confirmation of the impedance of the cable 405. The measurement performed by transmitter $TX_G$ 542 and receiver $RX_G$ 544 (where subscript "G" indicates ground) may permit monitoring of the current $I_{HF-G}$ 526, through the ground 524. The capacitor $C_G$ 528 permits reduction of the high frequency impedance to the ground 524. This makes the high-frequency ground current measurement more sensitive to the cable impedance (i.e., capacitance $C_C$ 520 and resistance $R_{isolation}$ 522).

Figure 8:
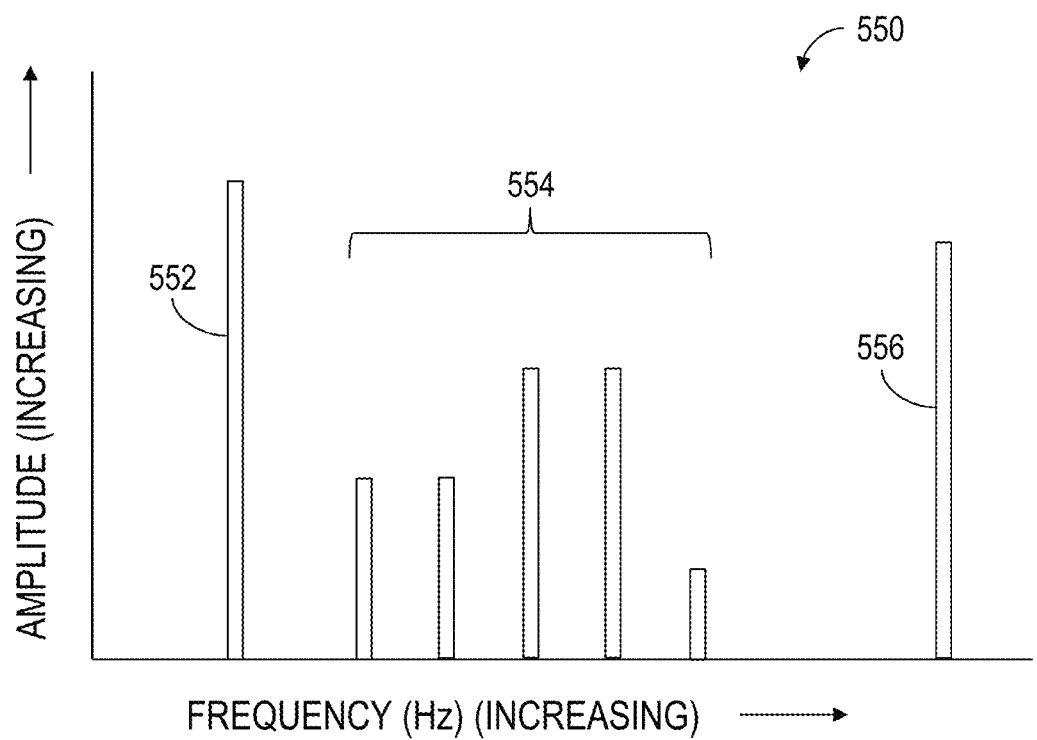
FIG. 8 is a graph related to one or more aspects of the present disclosure.

FIG. 8 is a graph 550 showing example frequencies detected by the receivers RX 514 installed at the PCR 410 extremity shown in FIG. 5. The graph 550 indicates presence of a wide range of frequencies detected via a plurality of bars indicative of frequency (shown along the horizontal axis) and amplitude (shown along the vertical axis) of the detected signals. A low frequency bar 552 is indicative of a base frequency generated by the generator 440. Noise may be added by a rectifier associated with a VFD at the LER 490. Such noise is indicated in the graph 550 by mid-frequency bars 554. A high-frequency bar 556 is indicative of the high-frequency signal injected by the transmitters 512. At the measurement system, a proper filter (e.g., filter 519) separates the high-frequency, low-amplitude signal from the power current. This permits detection from being polluted by the rectifier noise.

The frequency measurement operations permit determination of impedance of the medium-voltage power cable 405, which permits determination of a quality status of the power cable 405. For example, the detected impedance of the medium-voltage power cable 405 may be indicative of an electrical fault associated with one or more of the wires 504, 505, 506 of the power cable 405. Comparing the three phases may also add a criteria for the quality status. The transmitters $TX_G$ 542 and receivers $TX_G$ 544 facilitate determination of the isolation impedance via the ground 524, which is additional information related to the quality status of the power cable 405.

Receivers $RX_{Li}$ 534 and $RX_{Ri}$ 536 associated with transmitters $TX_{Li}$ 532 (where subscript "i" indicates each phase 1, 2, and 3) may facilitate a more accurate "differential" determination of isolation resistance $R_{isolation\_i}$ 522 along the power cable 405 for each phase, perhaps with less influence of the transformer resistance. The current leakage along the medium-voltage cable 405 may be determined by the difference between the current measurements at receivers $RX_{Li}$ 534 and $RX_{Ri}$ 536.

Furthermore, the transmitters $TX_{Li}$ 532 and $TX_G$ 542 may be activated one at a time while measurements may be performed simultaneously by the receivers $RX_{Li}$ 534, $RX_{Ri}$ 536, and $RX_G$ 544. Such combination permits complete determination of capacitance $C_{C\_i}$ 520, $C_{CG\_i}$ 521, and resistance $R_{isolation\_i}$ 522 for the three phases, which may permit full determination of the power cable 405 impedance. If simultaneous measurement is performed, then each transmitter $TX_{Li}$ 532 and $TX_G$ 542 may have to operate at a different frequency. Thus, analysis may be performed for the different frequencies, which may permit simultaneous determination of the overall impedance.

The measurement sensors may be installed on the PCR 410 end so that power is available for the activation of the sensors even if the main breaker 435 is open. The receivers $RX_{Ri}$ 536 on the LER 490 extremities may be powered via a low power, which may be fed via a pair of wires from the communication cable 408. The measurements performed by the receivers $RX_{Ri}$ 536 may be transmitted back to the PCR 480 via the communication cable 408, such that the MVFCD 420 may receive and process the measurements and generate a proper determination based on such measurements.

The measurement sensors TX 512 and RX 514 may include a ferromagnetic core that does not saturate under magnetic flux generated by the main phase wire (or the ground wire) when large phase AC current is present. Furthermore, detection of a low-amplitude, high-frequency signal while a high-amplitude, low-frequency signal is also present may be improved by coding the signal transmitted by the transmitters TX 512. The coding may be, for example, a sweep of frequency or digital coding. The reception at receivers RC may be performed after cross-correlation of the RC signal over the TX 512 signal.

When the power distribution system 400 is operated on land, the medium-voltage power cable 405 is laid on the ground, which exposes the cable 405 to traffic (e.g., people, forklifts, other vehicles) passing over the cable 405. Therefore, the cable 405 may be protected from mechanical damage that may be generated by such traffic. Depending on the application, such protection may be provided either locally (i.e., critical zone) or over the whole length of the cable 405. Local protection may include cable guards, trays, and/or bridges.

Figure 9:
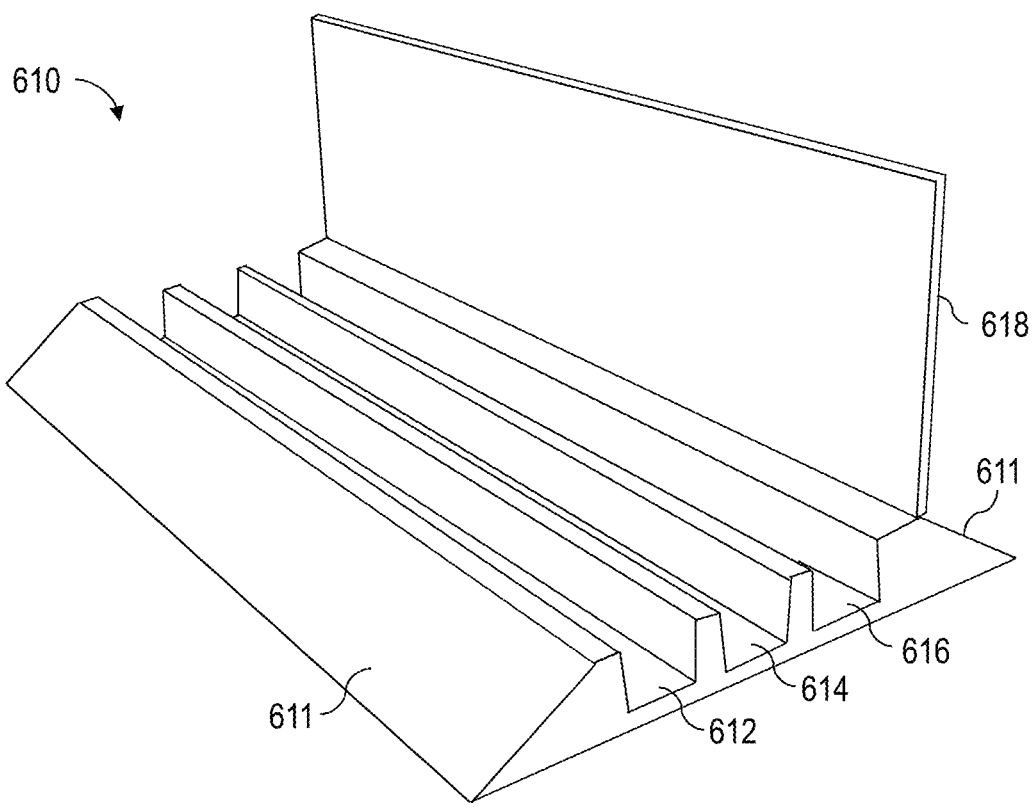
FIG. 9 is a schematic view of at least a portion of an example implementation of apparatus according to one or more aspects of the present disclosure.

FIG. 9 is a perspective view of at least a portion of an example cable guard 610 according to one or more aspects of the present disclosure. The cable guard 610 is configured to physically protect the medium-voltage power cable 405 and other cables and/or conduits from vehicular traffic, foot traffic, etc., while the cable 405 lies on the ground. The cable guard 610 may comprise a plurality of channels 612, 614, 616, each configured to receive therein a cable or conduit. The first channel 612 may receive the cable 405, the second channel 614 may receive the communication cable 408, and the third channel 616 may receive other conduits, such as hoses transmitting pressurized air or other fluids. The cable guard 610 may also comprise a movable cover 618 operable to selectively cover and expose the channels 612, 614, 616 and the cables and/or conduits disposed therein. Opposing sides of the cable guard 610 may comprise diagonal surfaces 611, which may accommodate or help vehicles to drive over the cable guard 610.

Figure 10:
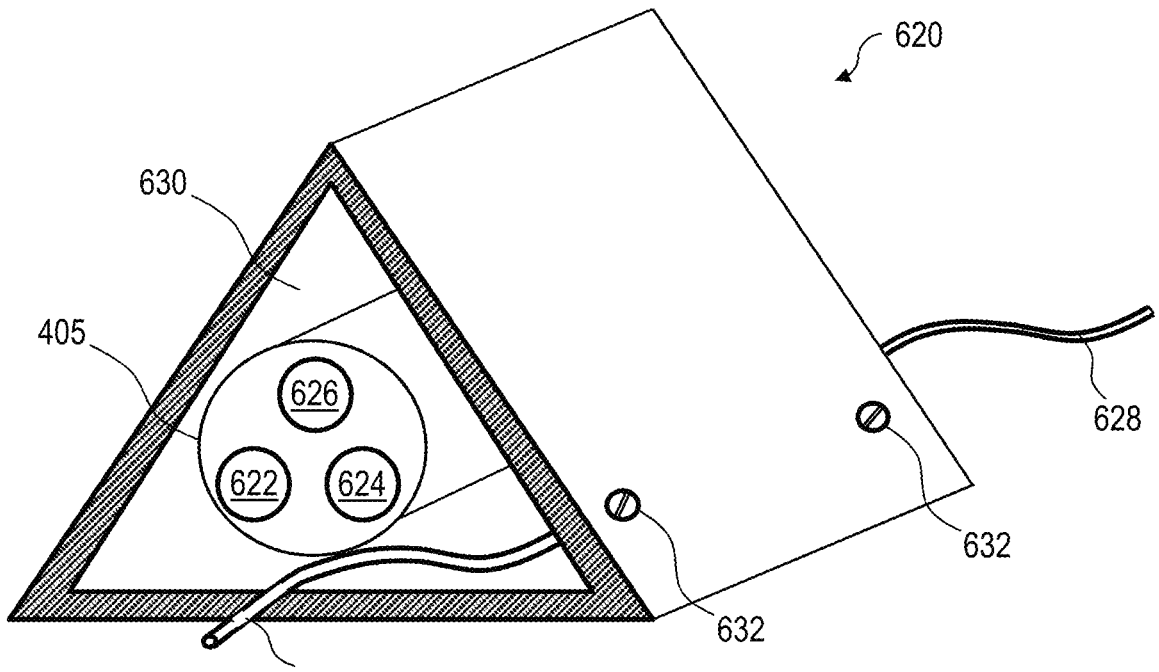
FIG. 10 is a schematic view of at least a portion of an example implementation of apparatus according to one or more aspects of the present disclosure.

FIG. 10 is a perspective view of at least a portion of another example cable guard 620 according to one or more aspects of the present disclosure. The cable guard 620 is configured to physically protect the medium-voltage power cable 405, such as from vehicular traffic, foot traffic, etc., while the cable lies on the ground. In some examples, the cable guard 620 may be formed of a metallic material, fiberglass, and/or another rigid materials. The power cable 405 illustrated in FIG. 4A may be formed with insulated conductors 622, 624, 626, such as stranded copper conductors, which are surrounded by a flexible insulating layer and/or material such as flexible plastic. Each of the conductors 622, 624, 626 of the power cable 405 may conduct one of the three-phase voltage generated at the stationary side, for example. Each of the conductors 622, 624, 626 of the power cable 405 may be and/or comprise an insulated copper conductor sized to carry 1,000 A or more at a voltage ranging between about 3,000 V and 4,160 V. However, the electrical voltage may be higher, such as, for example, 10,000 V.

The cable guard 620 is formed with a central passage 630 with an internal cross-sectional area that accommodates the power cable 405. The cable guard 620 may be formed in a generally triangular shape so that a lower surface (i.e., a base) thereof can rest on the ground while accommodating and supporting vehicular traffic on its upper surfaces. The cable guard 620 may be coupled, such as via a bolt and nut assembly 632, to an electrically conductive safety grounding link 628 (i.e., grounding conductor) that can be coupled to earth ground to provide a further level of safety for the power cable 405.

Figure 11:
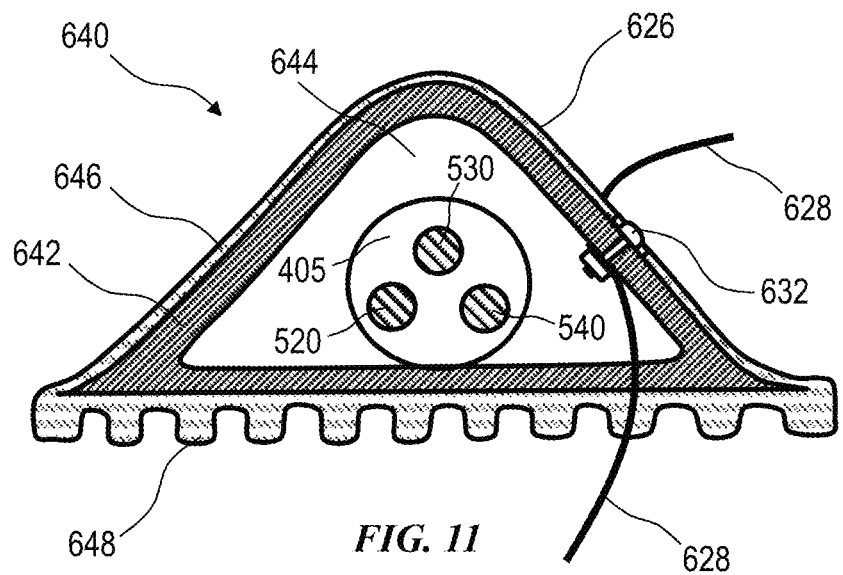
FIG. 11 is a schematic view of at least a portion of an example implementation of apparatus according to one or more aspects of the present disclosure.

FIG. 11 is a cross-sectional view of at least a portion of an example cable guard 640 according to one or more aspects of the present disclosure. The cable guard 640 includes a main body portion or housing 642. Inner surfaces of the housing 642 form a passage 644, which is substantially triangular in this example, through which the medium-voltage power cable 405 (including conductors 622, 624, 626) extends. The housing 642 therefore encloses the power cable 405 in the passage 644. The housing 642 may have a curved upper surface to reduce stress on one or more wellsite service vehicles that may be driven over the cable guard 640. The housing 642 of the cable guard 640 is of sufficient strength to support the weight of various wellsite service vehicles without collapsing onto the power cable 405. The housing 642 of the cable guard 640 may comprise or be aluminum, steel, fiberglass, and/or other example materials.

Although the housing 642 is described as being operable to support the weight of various wellsite service vehicles without collapsing onto the power cable 405, the housing 642 may be at least partially flexible or deformable (i.e., semi-rigid), such as may permit the cable guards 640 to flex or at least partially deform (e.g., bend along their longitudinal axes) as the power cable 405 with a plurality of the cable guards 640 disposed along its length is wound about a drum or spool. However, if the cable guards 640 comprise short axial lengths, the housings 642 of such cable guards 640 may comprise a substantially rigid constriction. The winding and unwinding operations of the power cable 405 are described below.

The cable guard 640 has an upper external covering 646 on upper exterior surfaces of the housing 642. The upper external covering 646 may be smooth or textured to prevent slippage by vehicles or personnel traversing over the cable guard 640. The cable guard 640 may further have a lower external covering 648 on a lower exterior surface of the housing 642, which may be textured (e.g., tread-shaped, grooved) to provide resistance (i.e., friction) to lateral displacement of the cable guard 640 across the ground. The upper external covering 646 and lower external covering 648 may be electrically insulating, such as by comprising or being a rubber, plastic, and/or other example insulating materials. The housing 642, which may be or include a metallic material, may be coupled to electrically conductive safety grounding link 628 via a bolt and nut assembly 632, such as to provide ground fault circuit interruption, for example.

Figure 12:
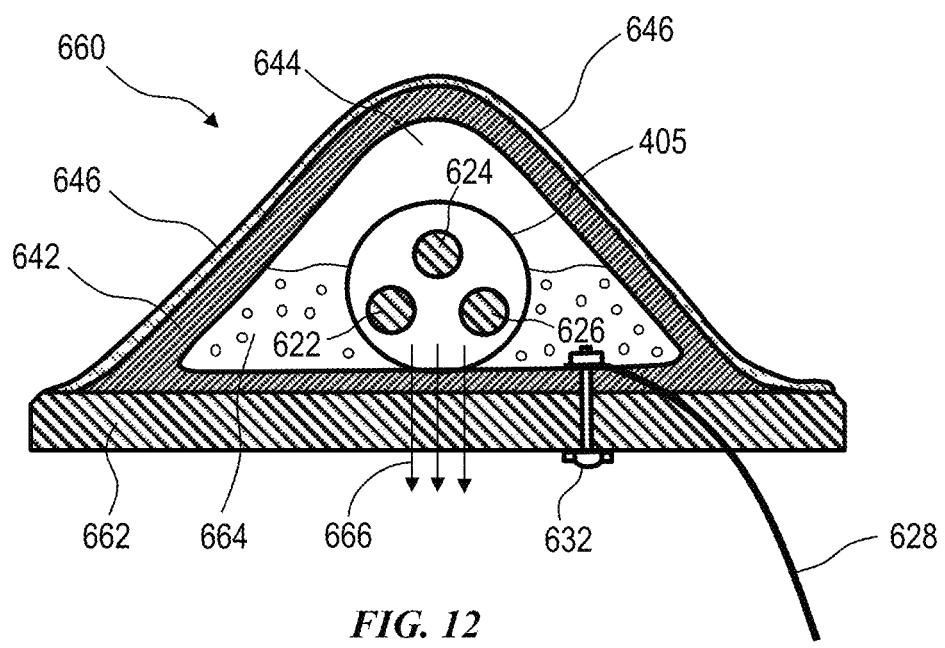
FIG. 12 is a schematic view of at least a portion of an example implementation of apparatus according to one or more aspects of the present disclosure.

FIG. 12 is a cross-sectional view of at least a portion of another example cable guard 660 according to one or more aspects of the present disclosure. The medium-voltage power cable 405 may be extended through the passage 644 of the cable guard 660 as described above. Similarly to the cable guard 640, the cable guard 660 comprises an upper housing 642 optimized for strength, such as to support vehicular traffic. However, the cable guard 660 also comprises a lower structure or base 662, which is optimized for strength and heat conduction between the internal passage 644 and external portions of the cable guard 660. For example, the base 662 may facilitate conduction or evacuation of heat generated by flow of current through the cable 405 to the ground. The base 662 may comprise a heat conductive material, such as a metal (e.g., bronze, aluminum, etc.). As the base 662 is also electrically conductive, the wire 628 and screw 632 may be connected with the base 662. The passage 644 (i.e., internal space) may be filled by a heat-conductive material 664 to increase heat conduction from the cable 405 to the base 662 and, thus, to the ground, as indicated by arrows 666. The material 664 may comprise a deformable material, such as rubber, silicon, RTV, etc., filled with a heat conductive material, such as glass, metal beads, etc. The material 664 may be selected to be either electrically conductive or electrically isolative, such as based on the amount of the deformable material utilized in the material 664. Whether the material 664 is electrically conductive may depend on the overall strategy of how to protect workers from the electrical power conducted via the cable 405. The cable 405 may also include a fourth conductor (not shown), such as a ground wire or an armored or electrical shield.

Figure 13:
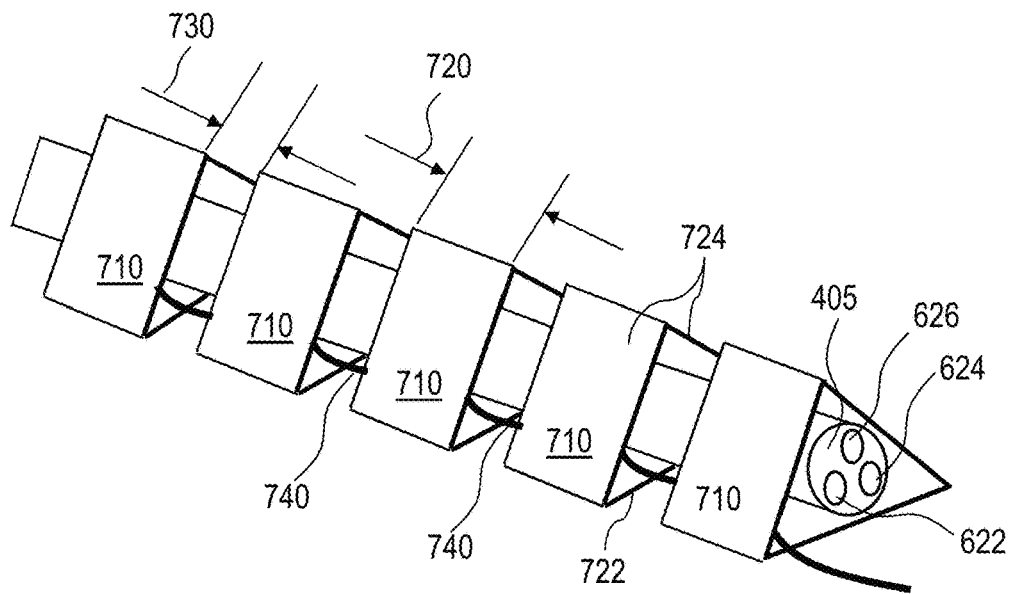
FIG. 13 is a schematic view of at least a portion of an example implementation of apparatus according to one or more aspects of the present disclosure.

FIG. 13 is a perspective view of multiple instances of cable guards 710 with the medium-voltage power cable 405 extending through the cable guards 710 according to one or more aspects of the present disclosure. Each of the cable guards 710 can be or include one or more aspects of the example cable guards 610, 620, 640, 660 described above. Each of the cable guards 710 has a width 720, which may be, for example, between about 10 centimeters (cm) and about 60 cm. The length of each cable guard 710 may be between about 15 cm and about 60 cm. As described above, shorter cable guards 710 may comprise a substantially rigid construction, while longer cable guards 710 may be deformable.

Neighboring ones of the cable guards 710 may be separated by a separation distance 730, which may be less than about 5 cm. Safety grounding links 740 may be connected between neighboring ones of the cable guards 710. Examples of safety grounding links 740 may include electrically conductive cables, electrically conductive chains, and/or other example electrically conductive links. The links 740 may impose the axial distances between successive cable guards 710. Different types of links 740 may be used between cable guards 710. One type of links 740 may be used for electrical purposes, while another type of links 740 may set mechanical position of the successive cable guards 710. Respective lengths of the safety grounding links 740 may be equal to or less than the separation distance 730. Different or the same separation distances 730 may be set between neighboring pairs of the cable guards 710, and different or the same lengths may be used for the safety grounding links 740. One or more of the safety grounding links 740, such as the safety grounding link 740 nearest to the stationary side, can be electrically coupled to a GFCD of the MVFCD 420 shown in FIG. 4A, for detection of ground faults. By having multiple safety grounding links 740, flexibility of the power cable 405 may be accommodated, for example.

Figure 14:
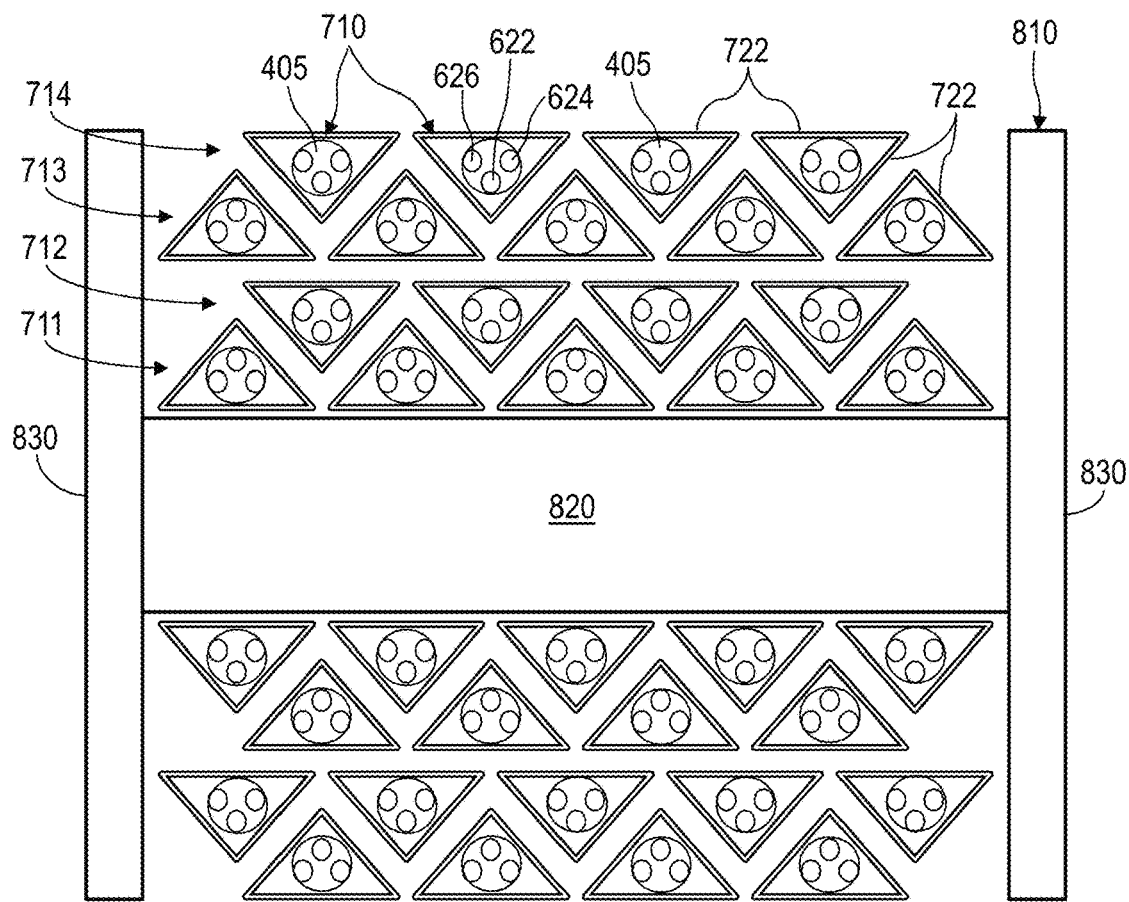
FIG. 14 is a schematic view of at least a portion of an example implementation of apparatus according to one or more aspects of the present disclosure.

FIG. 14 is a cross-sectional view of at least a portion of a spool 810 comprising the medium-voltage power cable 405 with the cable guards 710 at least partially wound around according to one or more aspects of the present disclosure. The spool 810 in some examples is mounted on a skid (e.g., skid 134 in FIGS. 1 and 2) of a local electrical room module of a well construction apparatus. The spool 810 includes a support cylinder 820 and lateral flanges 830 on opposing ends of the support cylinder 820. The power cable 405 is wound around the support cylinder 820 and between the lateral flanges 830. The power cable 405 extends through multiple instances of the cable guards 710, such as illustrated in and described with respect to FIG. 13, and hence, the cable guards 710 are also on the spool 810 when the power cable 405 is wound on the spool 810.

The power cable 405 may be wound onto the rotatable spool 810 forming successive layers 711, 712, 713, 714 of cable guards 710, wherein the cable guards 710 of each successive layer 711, 712, 713, 714 may be oriented in opposing directions. Each of the cable guards 710 may comprise a substantially triangular cross-section having a horizontal base 722 and laterally extending sides 724. Thus, when the power cable 405 is wound onto the rotatable spool 810, the cable guards 710 of each successive layer 711, 712, 713, 714 may be oriented in opposing directions such that the horizontal bases 722 and the laterally extending sides 724 of each successive layer 711, 712, 713, 714 abut.

In some examples, the cable guards 710 are not rigidly linked together or to the power cable 405. This can facilitate rotation of each cable guard 710 around the power cable 405 at least to some degree. The rotation of each cable guard 710 may permit cable guards 710 between adjoining rows on the spool 810 to fit together to permit a degree of compaction when the power cable 405 is wound on the spool 810. As an example, assuming that a cross section of each cable guard 710 is an equilateral triangle and that the power cable 405 is wound on the spool 810 in a first row on the support cylinder 820 and a subsequent second row adjoining the first row, one side of the cable guards 710 on the first row can lay flush along the support cylinder 820 at least along a line parallel to a longitudinal axis of the support cylinder 820 (e.g., due to the nature of a cylinder contacting respective substantially planar sides), and cable guards 710 on the second row could be rotated 60 degrees relative to the cable guards 710 on the first row such that the cable guards 710 in the second row could fit between cable guards 710 in the first row. This pattern can then be repeated for subsequent rows, such as what is illustrated in FIG. 14. In other examples, the cross sections of the cable guards 710 may be different from an equilateral triangle, and hence, rotation of cable guards 710 between different rows may vary. In some examples, the cable guards 710 are symmetrical to permit a degree of compaction on the spool 810, for example.

Figure 15:
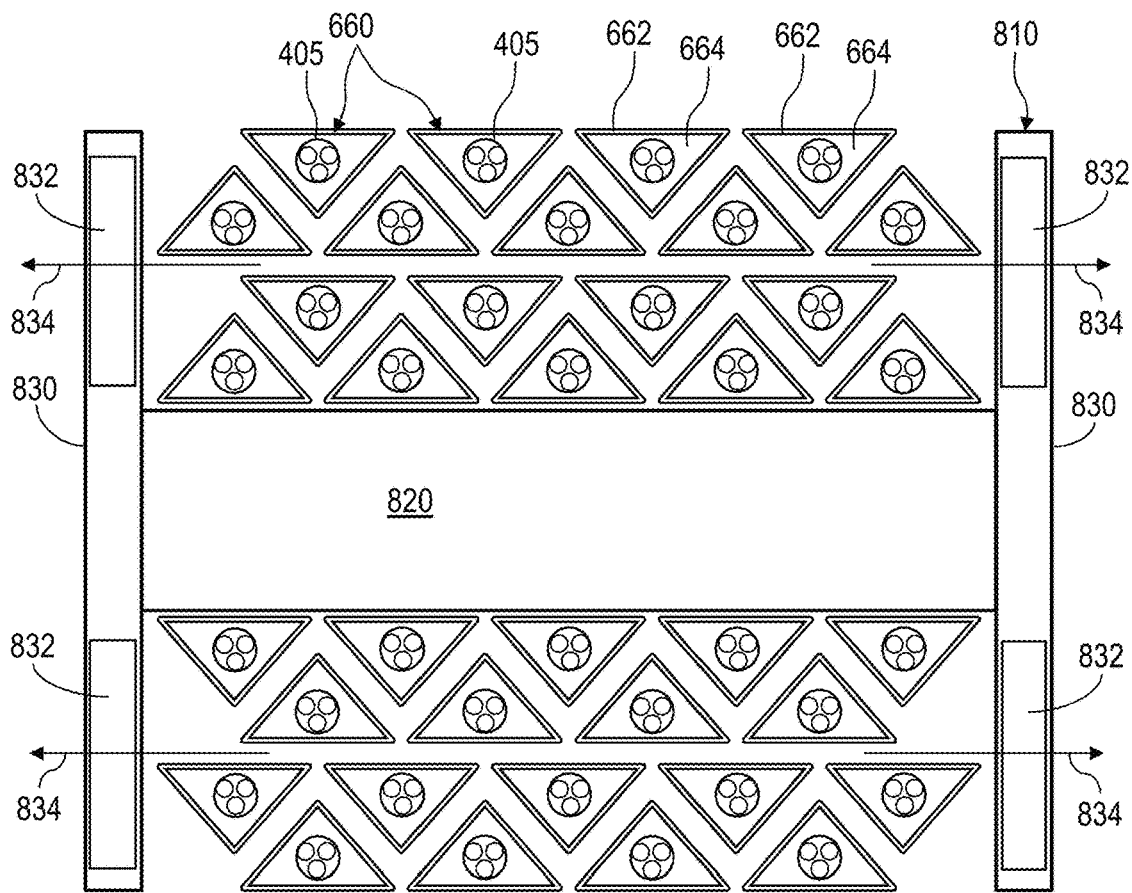
FIG. 15 is a schematic view of at least a portion of an example implementation of apparatus according to one or more aspects of the present disclosure.

FIG. 15 is another cross-sectional view of at least a portion of the spool 810 comprising the medium-voltage power cable 405 with the cable guards 660 at least partially wound around or "rolled" onto the support cylinder 820 of the spool 810 according to one or more aspects of the present disclosure. Similarly as when disposed on the ground, the cable guards 660 can also facilitate heat transfer from the cable 405 when rolled onto the spool 810. Between layers of the cable guards 660, the heat conductive bases 662 permit heat flow for the most inner portions of the power cable 405 laterally towards the lateral flanges 830 (i.e., rims) of the spool 810, as indicated by arrows 834. This lateral flanges 830 may comprise lateral openings 832, be substantially open, or otherwise permit heat transmission to the surrounding air even when multiple layers are on the spool 810. The cable guards 660 may be alternatively oriented with their bases 662 facing toward or away from the support cylinder 820, such as to reduce stacking height around the spool 810.

Figure 16:
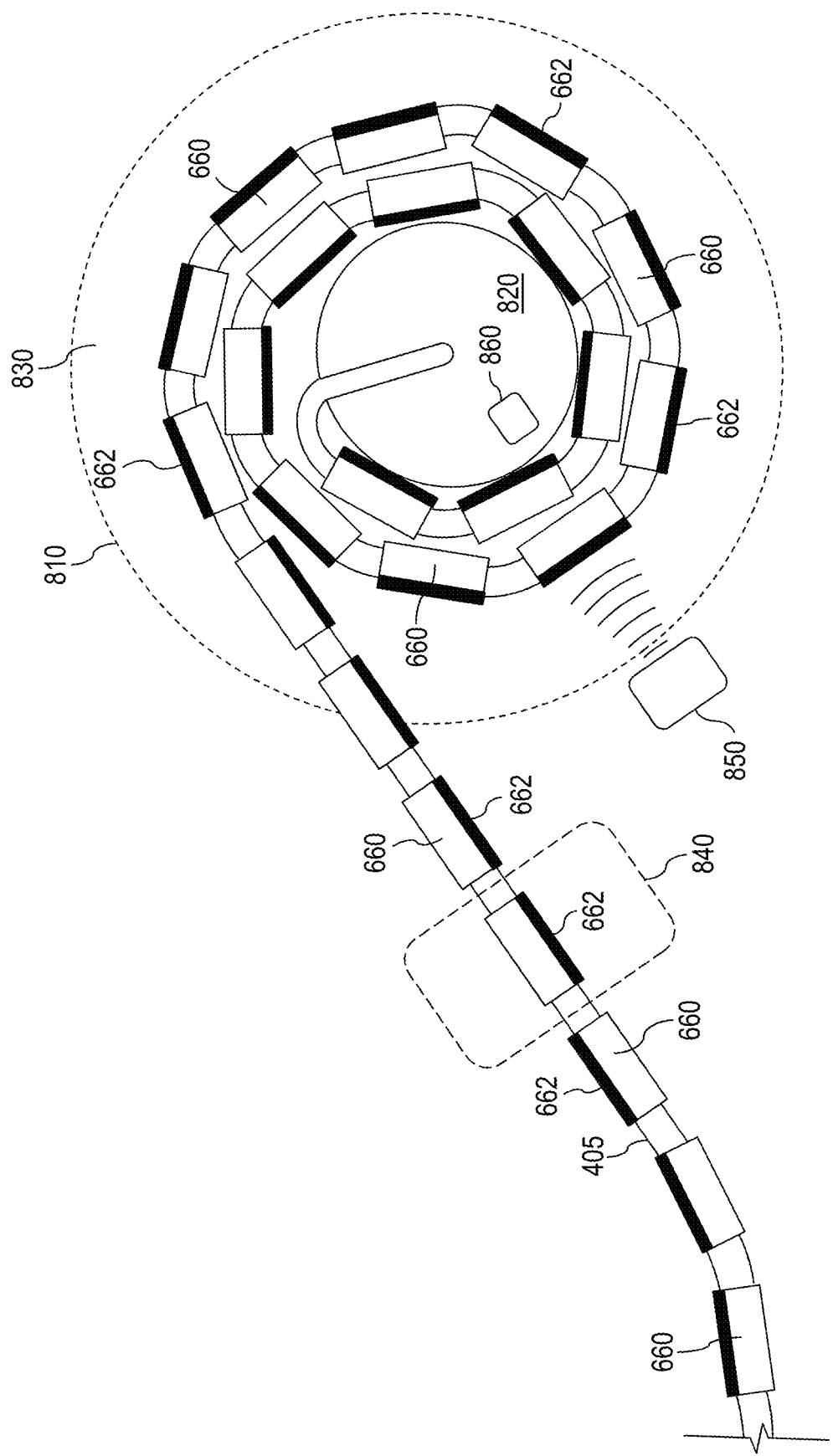
FIG. 16 is a schematic view of at least a portion of an example implementation of apparatus according to one or more aspects of the present disclosure.

FIG. 16 is a cross-sectional view of at least a portion of a guard orienting device 840 operable to rotate or otherwise orient the cable guards 660 (or other cable guards 710 within the scope of the present disclosure) such that the bases 662 are alternatingly facing toward or away from the support cylinder 820, depending on which layer of cable guards 660 is being wound onto the spool 810. During spooling operations, a detector 850 may track the orientation of the guards 660. Such detector 850 may be a video camera detecting color of the guards 660, which may have different colors on opposing sides. For example, the base 664 (i.e., the bottom side) may be metallic, while the external covering 646 (i.e., the top side) may be covered with a layer of rubber or plastic having a predetermined color (e.g., black rubber, white or light colored plastic). An additional sensor 860 may record rotation of the spool 830 to facilitate determination of movement and to determine an "end" of a given layer to cause the orienter 840 to flip or otherwise change the orientation of the cable guards 660. During unspooling of the cable 405, the guard orienter 840 may rotate the guards 660 such that the guards 660 are oriented with their bases 662 directed towards the ground.

Local protection may also provide electrical protection for people. For example, local cable protection may be provided by a local cable tray (not shown), which may comprise electrically insulating materials. The cable tray may be installed locally at walkways or vehicle paths coinciding with the cable 405 before power is transmitted by the cable 405. The cable trays may be heavy, such as may define a bridge for vehicles. Furthermore, fences and marking may also be installed to insure that the cable crossing by vehicles is performed where cable protection is provided.

Figure 17:
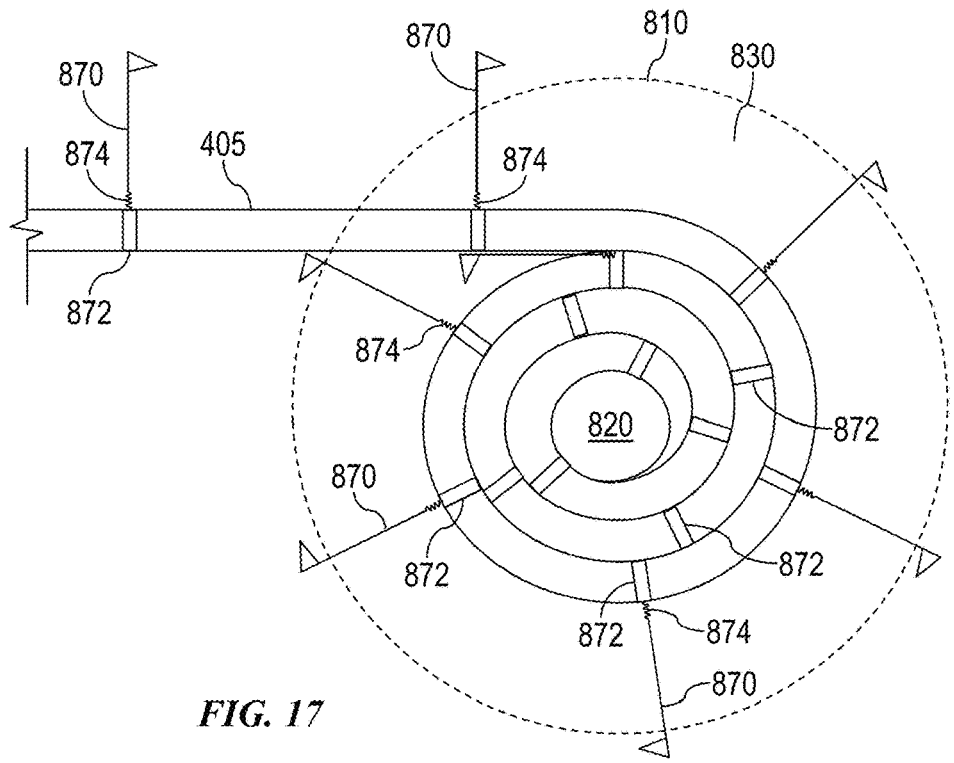
FIG. 17 is a schematic view of at least a portion of an example implementation of apparatus according to one or more aspects of the present disclosure.

The medium-voltage power cable 405 may also be equipped with flexible flags or other visual markers or indicators to identify or improve visibility of the cable 405. FIG. 17 is a side sectional view of an example implementation of the cable 405 wound about a support cylinder 820 of a cable spool 830 and having a plurality of flags 870 attached thereto according to one or more aspects of the present disclosure. The flags 870 may be attached to the cable 405 via corresponding clamps 872. Flexible connectors 874, such as springs, may be utilized to connect the flags 870 with the clamps 872. The flexible connectors 874 permit the flags to fold or bend sideways against the cable 405 as the cable 405 is wound onto the spool 830 and/or routed through a cable guard or tray or under a bridge (not shown).

Figure 18:
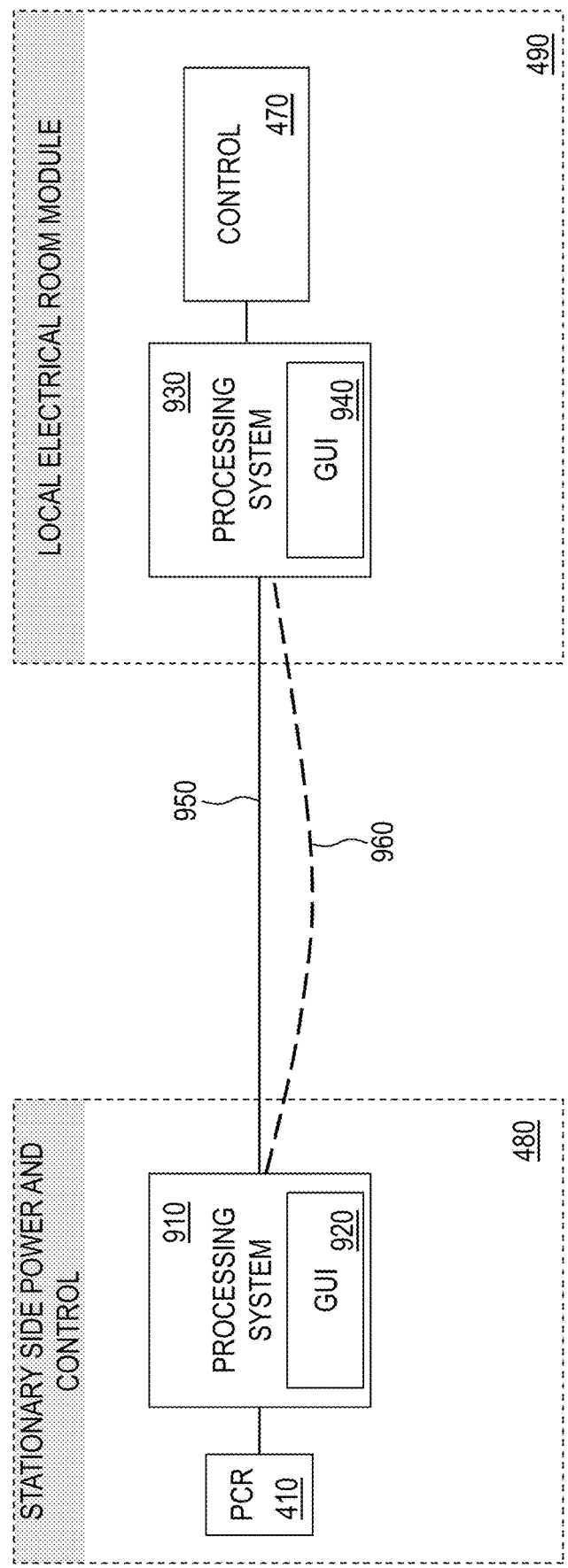
FIG. 18 is a schematic view of at least a portion of an example implementation of apparatus according to one or more aspects of the present disclosure.

FIG. 18 is a schematic view of a safety and/or security apparatus associated with a power distribution system according to one or more aspects of the present disclosure. The apparatus includes a processing system 910 with a graphical user interface (GUI) 920 at the stationary side 480 and a processing system 930 with a GUI 940 at the LER 490. An example processing system is described in further detail below. The processing system 910 at the stationary side 480 is communicatively coupled to the processing system 930 at the LER 490 via a communication cable 950 and/or wireless communication channel 960. The communication cable 950 may be integral to, attached to, or otherwise carried with the medium-voltage power cable 405, which may also be spooled on the power cable spool at the LER 490. However, the communication cable 950 may be or comprise the communication cable 408 separate from the power cable 405 and wound on a separate spool 452, as described above and shown in FIG. 4A. At the LER 490, the control system 470 associated with the processing system 930 and GUI 940 may be powered from a local source of power and not via the cable 405, such as when power via the cable 405 in not established. Such local power may be provided independently via the communication cable 950 (e.g., low power based on 110 V or 220 V) or even from a UPS system, which may be changed when power is available (i.e., via the cable 405). In an example implementation of the power distribution system, the receivers (shown in FIG. 7) and the processing system 930 may be electrically powered via the local power source such that the MVFCD 420 can activate the one or more breakers 435 or relays.

Referring to FIGS. 4A, 4B, 4C, and 18 together, the processing system 910 and one or more components in the PCR 410 operate in conjunction to control the opening and closing of a circuit breaker, switch, or other equipment that electrically couples the medium-voltage power cable 405 with a power source (e.g., the generator 440 and/or transformer 430) at the stationary side 480. In some examples, closing (and remaining closed) of the circuit breaker, switch, or other equipment at the stationary side 480 is dependent upon the processing system 910 having a message input by personnel at the stationary side 480 and receiving one or more messages from the processing system 930, which together can indicate that the power cable 405 is appropriately connected and ready to be energized.

As an example, personnel can unreel the power cable 405 from a spool of the LER 490 and connect the power cable 405 to a connection at the stationary side 480. The connection at the stationary side 480 may be directly or indirectly to the circuit breaker, switch, or other equipment. Personnel at the stationary side 480 then input a message to the processing system 910, e.g., via the GUI 920. Personnel at the LER 490 also input a message to the processing system 930, e.g., via the GUI 940, which is communicated to the processing system 910 at the stationary side 480, e.g., via the communication cable 950 and/or wireless communication channel 960. The processing system 910 then determines whether the messages input by personnel to the processing system 910 and received from the processing system 930 are authorized. If both messages are authorized, the processing system 910 at the stationary side 480 operates in conjunction with control components in the PCR 410 to permit closing of the circuit breaker, switch, or other equipment at the stationary side 480 to thereby energize the power cable 405 when the generator 440 and transformer 430 are operating.

The processing system 910 permits the medium-voltage power cable 405 to be electrically coupled to the power source when the messages are authorized, even though the circuit breaker, switch, or other equipment may remain open due to other control components in the PCR 410 prohibiting the power cable 405 from being electrically coupled to the power source due to other conditions not being met, faults occurring, and/or other circumstances. The processing system 910 prohibits the power cable 405 from being electrically coupled to the power source when the messages are not authorized. Furthermore, the MVFCD 420 determines if predetermined conditions are simultaneously present to engage the breaker 435. Such conditions may include status of the detectors and sensors and/or status of requests from the operators in the stationary side 480 and/or the LER 490.

To determine whether the messages are authorized, the messages may be maintained in the processing system 910 by a protected administrative process providing controlled access by a designated operator. The messages may be encoded employing, for example, an Advanced Encryption System (AES) 256 encoding process and/or another encoding process. The protected administrative process may define a time period in which messages may be authorized, where outside of that time period, those messages will not be authorized (and hence, expired). The messages input by personnel to the processing system 910 and received from the processing system 930 can be compared to the messages maintained in the processing system 910 to identify when an input and/or received message matches a maintained message to thereby indicate that an authorized message has been input and/or received. If an input and/or received message does not match a maintained message, the input and/or received message is not authorized.

The communication of one or more messages between the processing systems 910 and 930 can use encryption. For example, the processing system 930 may encrypt and transmit one or more messages to the processing system 910 by employing a public key received by the processing system 930 from the processing system 910. Any encryption technique may be used.

The processing system 930 at the LER 490 may continuously and/or repeatedly transmit one or more messages to the processing system 910 at the stationary side 480 to indicate that the medium-voltage power cable 405 should remain energized, such as based on proper operating conditions at the well construction apparatus. The continuous and/or repeated transmission may be at a predetermined time interval. Upon termination of the transmission of the message by the processing system 930 and/or upon exceeding a receipt time interval (which may be equal to or less than the predetermined time interval) from the time at which a previous message was received without receiving another message at the processing system 910, the processing system 910 at the stationary side 480 can cause the circuit breaker, switch, or other equipment at the stationary side 480 to open and de-couple the power cable 405 from the power source. The processing system 930 may terminate transmitting the message in response to an input, e.g., through the GUI 940, by personnel (e.g., an operator), and/or automatically in response to detected faults or hazards at the well construction apparatus, such as may be detected by the control 470.

Figure 19:
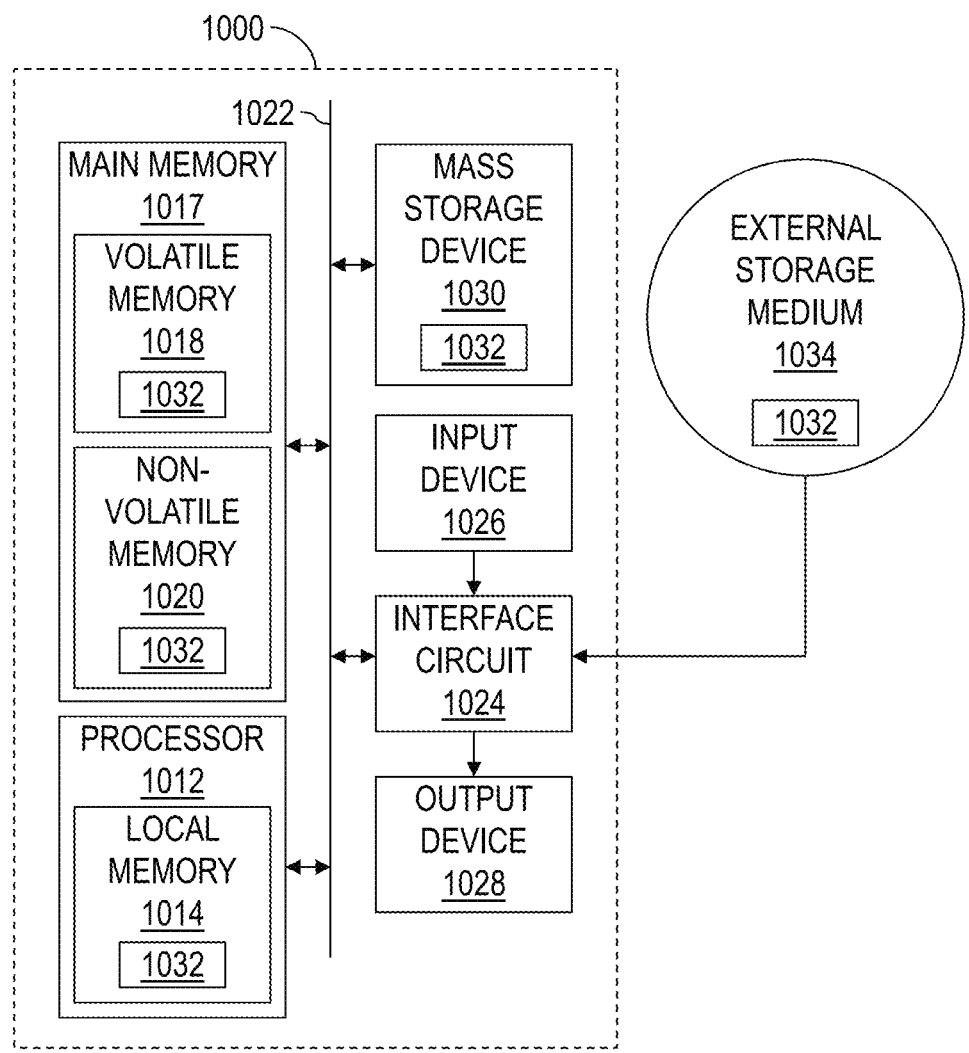
FIG. 19 is a schematic view of at least a portion of an example implementation of apparatus according to one or more aspects of the present disclosure.

FIG. 19 is a schematic view of at least a portion of an example implementation of a processing system 1000 according to one or more aspects of the present disclosure. The processing system 1000 may be an example of each of the processing systems 910 and 930 in FIG. 18 and may execute example machine-readable instructions to implement at least a portion of one or more of the methods and/or processes described herein.

The processing system 1000 may be or comprise, for example, one or more processors, controllers, special-purpose computing devices, server devices, personal computers, network appliances, programmable logic controller (PLC), industrial computer, and/or other types of computing devices. Various functionalities and components of a processing system can be in a single device or distributed across multiple devices.

The processing system 1000 comprises a processor 1012 such as, for example, a general-purpose programmable processor. The processor 1012 may comprise a local memory 1014, and may execute program code instructions 1032 present in the local memory 1014 and/or in another memory device. The processor 1012 may execute, among other things, machine-readable instructions or programs to implement the methods and/or processes described herein. The programs stored in the local memory 1014 may include program instructions or computer program code that, when executed by an associated processor, may facilitate functionality as described herein. The processor 1012 may be, comprise, or be implemented by one or more processors of various types operable in the local application environment, and may include one or more general purpose processors, special-purpose processors, microprocessors, digital signal processors (DSPs), field-programmable gate arrays (FPGAs), application-specific integrated circuits (ASICs), processors based on a multi-core processor architecture, and/or other processors. More particularly, examples of a processor 1012 include one or more INTEL microprocessors, microcontrollers from the ARM and/or PICO families of microcontrollers, embedded soft/hard processors in one or more FPGAs, etc.

The processor 1012 may be in communication with a main memory 1017, such as via a bus 1022 and/or other communication means. The main memory 1017 may comprise a volatile memory 1018 and a non-volatile memory 1020. The volatile memory 1018 may be, comprise, or be implemented by a tangible, non-transitory storage medium, such as random access memory (RAM), static random access memory (SRAM), synchronous dynamic random access memory (SDRAM), dynamic random access memory (DRAM), RAMBUS dynamic random access memory (RDRAM), and/or other types of random access memory devices. The non-volatile memory 1020 may be, comprise, or be implemented by a tangible, non-transitory storage medium, such as read-only memory, flash memory and/or other types of memory devices. One or more memory controllers (not shown) may control access to the volatile memory 1018 and/or the non-volatile memory 1020.

The processing system 1000 may also comprise an interface circuit 1024 connected and communicatively coupled to the bus 1022. The interface circuit 1024 may be, comprise, or be implemented by various types of standard interfaces, such as an Ethernet interface, a universal serial bus (USB), a third generation input/output (3GIO) interface, a wireless interface, and/or a cellular interface, among other examples. The interface circuit 1024 may also comprise a graphics driver card. The interface circuit 1024 may also comprise a communication device such as a modem or network interface card to facilitate exchange of data with external computing devices via a network, such as via Ethernet connection, digital subscriber line (DSL), telephone line, coaxial cable, cellular telephone system, and/or satellite, among other examples.

One or more input devices 1026 may be connected to the interface circuit 1024. One or more of the input devices 1026 may permit a user to enter data and/or commands for utilization by the processor 1012. Each input device 1026 may be, comprise, or be implemented by a keyboard, a mouse, a touchscreen, a track-pad, a trackball, an image/code scanner, and/or a voice recognition system, among other examples.

One or more output devices 1028 may also be connected to the interface circuit 1024. One or more of the output device 1028 may be, comprise, or be implemented by a display device, such as a liquid crystal display (LCD), a light-emitting diode (LED) display, and/or a cathode ray tube (CRT) display, among other examples, which may further facilitate the GUIs 920 and 940 described above. One or more of the output devices 1028 may also or instead be, comprise, or be implemented by a printer, speaker, and/or other examples.

The processing system 1000 may also comprise a mass storage device 1030 for storing machine-readable instructions and data. The mass storage device 1030 may be connected to the interface circuit 1024, such as via the bus 1022. The mass storage device 1030 may be or comprise a tangible, non-transitory storage medium, such as a floppy disk drive, a hard disk drive, a compact disk (CD) drive, and/or digital versatile disk (DVD) drive, among other examples. The program code instructions 1032 may be stored in the mass storage device 1030, the volatile memory 1018, the non-volatile memory 1020, the local memory 1014, and/or on a removable storage medium 1034, such as a CD or DVD.

The modules and/or other components of the processing system 1000 may be implemented in accordance with hardware (such as in one or more integrated circuit chips, such as an ASIC), or may be implemented as software or firmware for execution by a processor. In the case of firmware or software, the implementation can be provided as a computer program product including a computer readable medium or storage structure containing computer program code (i.e., software or firmware) for execution by the processor.

In view of the entirety of the present disclosure, including the figures and the claims, a person having ordinary skill in the art will readily recognize that the present disclosure introduces an apparatus comprising: an electrical power cable configured to electrically couple electrical power from a stationary electrical power source to a load at a moveable well construction apparatus; and a plurality of cable guards distributed along the electrical power cable, wherein each of the cable guards has an enclosed interior cross section through which the electrical power cable extends.

Each or some of the cable guards may be deformable.

Each or some of the cable guards may be rigid.

Each or some of the cable guards may be a curved upper exterior surface.

Each or some of the cable guards may comprise aluminum and/or steel.

Each or some of the cable guards may be capable of supporting the weight of a wellsite service vehicle without collapsing the enclosed interior cross section.

Each or some of the cable guards may have a textured exterior surface. The textured exterior surface may comprise grooves operable to cause friction against: a surface on which the electrical power cable is unwound; and/or a vehicle driving over the cable guard.

Each or some of the cable guards may include an electrically insulating exterior layer.

Each or some of the cable guards may be electrically connected to earth ground via a grounding conductor.

The apparatus may further comprise a heat conductive material disposed within the enclosed interior cross section of each of the cable guards. The heat conductive material may be in contact with the electrical power cable, and may be operable to transfer heat from the electrical power cable to the cable guards. The electrical power cable may be wound onto and capable of being unwound from a rotatable spool, and the heat conductive material and the cable guards may be collectively operable to transfer heat to: a surface onto which the electrical power cable is unwound; and ambient air when the electrical power cable is wound.

The apparatus may further comprise electrically conductive links, and each electrically conductive link may be mechanically and electrically coupled between a neighboring pair of the cable guards. In such implementations, among others within the scope of the present disclosure, the apparatus may further comprise a ground fault detection circuit electrically coupled to the electrically conductive links and the cable guards.

Each or some of the cable guards may have a width ranging between 10 centimeters and 30 centimeters in a direction perpendicular to the enclosed interior cross section.

Each of the cable guards may have the same symmetrical exterior cross section parallel to the enclosed interior cross section.

The electrical power cable with the plurality of cable guards may be wound onto a rotatable spool in a manner permitting unwinding from the rotatable spool. The electrical power cable wound around the rotatable spool may form successive layers of cable guards. The cable guards of each successive layer may be oriented in opposing directions. The successive layers may include a first layer interposing and abutting each of a second layer and a third layer, wherein each cable guard may comprise a substantially triangular cross-section having a horizontal base and laterally extending sides, and wherein the cable guards forming each successive layer may be oriented in opposing directions such that: the horizontal bases of each cable guard in the first layer abut the horizontal bases of each cable guard in the second layer, and the laterally extending sides of each cable guard in the first layer abut the laterally extending sides of each cable guard in the third layer.

The present disclosure also introduces a method comprising reeling or unreeling an electrical power cable onto or from a spool, wherein: the electrical power cable is configured to electrically couple electrical power from a stationary electrical power source to a load at a moveable well construction apparatus; the electrical power cable extends through respective enclosed interior cross sections of cable guards; and the cable guards are reeled onto or unreeled from the spool with the electrical power cable.

Each or some of the cable guards may be deformable.

Each or some of the cable guards may be rigid.

Each or some of the cable guards may have a curved upper exterior surface.

Each or some of the cable guards may comprise aluminum and/or steel.

Each or some of the cable guards may be capable of supporting the weight of a wellsite service vehicle without collapsing the enclosed interior cross section.

Each or some of the cable guards may have a textured exterior surface. The textured exterior surface may comprise grooves causing friction against: a surface on which the electrical power cable is unwound; and/or a vehicle driving over the cable guard.

Each or some of the cable guards may include an electrically insulating exterior layer.

The method may further comprise electrically connecting one or more of the cable guards to earth ground via a grounding conductor.

A heat conductive material may be disposed within the enclosed interior cross section of each or some of the cable guards, such that the heat conductive material is in contact with the electrical power cable and the conductive material transfers heat from the electrical power cable to the cable guards. The heat conductive material and the cable guards may transfer the heat to: a surface onto which the electrical power cable is unreeled; and ambient air when the electrical power cable is reeled.

An electrically conductive link may be mechanically and electrically coupled between one or more neighboring pairs of the cable guards. A ground fault detection circuit electrically may be coupled to the electrically conductive links and the cable guards.

Each or some of the cable guards may have a width ranging between 10 centimeters and 30 centimeters in a direction perpendicular to the enclosed interior cross section.

Each or some of the cable guards may have the same symmetrical exterior cross section, parallel to the enclosed interior cross section.

The electrical power cable with the cable guards may be reeled onto the spool to form successive layers of cable guards such that the cable guards of each successive layer are oriented in opposing directions. For example, each of the cable guards may comprise a substantially triangular cross-section having a horizontal base and laterally extending sides, wherein the cable guards forming each successive layer are oriented in opposing directions such that at least one of the horizontal bases of the cable guards in a first one of the layers abuts at least one of the horizontal bases of the cable guards in a second one of the layers, and at least one of the laterally extending sides of the cable guards in a third one of the layers abuts at least one of the laterally extending sides of the cable guards in a fourth one of the layers.

The present disclosure also introduces an apparatus comprising: a power source at a stationary side; an electrical power cable extending from the stationary side to a moveable well construction apparatus; a first processing system at the moveable well construction apparatus and comprising a processor and a memory including computer program code, wherein the first processing system is operable to transmit a first message; and a second processing system at the stationary side and comprising a processor and a memory including computer program code. The second processing system is operable to: receive the first message from the first processing system; receive a second message input through an input device of the second processing system; permit the electrical power cable to be electrically coupled to the power source when the first message and the second message are authorized; and prohibit the electrical power cable from being electrically coupled to the power source when at least one of the first message and the second message is not authorized.

The first processing system may be operable to encrypt the first message, and the second processing system may be operable to decrypt the first message. For example, the first message may be encrypted employing a public key received from the second processing system.

The first processing system may be operable to repeatedly transmit the first message until a termination condition occurs. The first processing system may be operable to terminate transmitting the first message when the termination condition occurs. The termination condition may occur in response to user input that is input to the first processing system. The second processing system may be operable to prohibit the electrical power cable from being electrically coupled to the power source upon failing to receive the first message after a predefined period of time after previously receiving the first message.

The second processing system may be operable to maintain the first message and the second message by a protected process. The first message and the second message may be ones of plural first messages and plural second messages, respectively. The plural first messages and the plural second messages may be encoded employing an AES 256 encoding process. The plural first messages and the plural second messages may expire at respective conclusions of predetermined time periods.

The first processing system may be operable to transmit the first message to the second processing system via a communication cable, a wireless communication channel, or a combination thereof.

The present disclosure also introduces a method comprising: receiving a first message as user input at a first processing system, wherein the first processing system is at a moveable well construction apparatus and comprises a processor and a memory including computer program code; transmitting the first message from the first processing system; receiving the first message at a second processing system, wherein the second processing system is at a stationary side and comprises a processor and a memory including computer program code; receiving a second message as user input at the second processing system; permitting, by the second processing system, an electrical power cable to be electrically coupled to a power source at the stationary side when the first message and the second message are authorized; and prohibiting, by the second processing system, the electrical power cable from being electrically coupled to the power source when at least one of the first message and the second message is not authorized.

The method may further comprise: encrypting the first message by the first processing system before transmitting the first message, wherein the encrypted first message is transmitted; and decrypting the first message by the second processing system. The first message may be encrypted employing a public key received from the second processing system.

The first processing system may repeatedly transmit the first message until a termination condition occurs. The first processing system may terminate transmitting the first message when the termination condition occurs. The termination condition may occur in response to user input that is input to the first processing system. Prohibiting, by the second processing system, the electrical power cable from being electrically coupled to the power source may occur upon the second processing system failing to receive the first message after a predefined period of time after previously receiving the first message.

The second processing system may maintain the first message and the second message by a protected process. For example, the first message and the second message may be ones of plural first messages and plural second messages, respectively. The plural first messages and the plural second messages may be encoded employing an AES 256 encoding process. The plural first messages and the plural second messages may expire at respective conclusions of predetermined time periods.

The first and second processing systems may respectively transmit and receive the first message via a communication cable, a wireless communication channel, or a combination thereof.

The present disclosure also introduces an apparatus comprising: a rotatable spool positioned at and affixed to a moveable well construction apparatus at a wellsite; and an electrical power cable at least partially wound on the rotatable spool and connected to stationary equipment at an end of the electrical power cable distal from the rotatable spool.

The rotatable spool may be a first rotatable spool, and the apparatus may further comprise: a second rotatable spool positioned at the moveable well construction apparatus; and an electrical communication cable at least partially wound on the second rotatable spool and connected to the stationary equipment at an end of the electrical communication cable distal from the second rotatable spool. The electrical power cable may transfer electrical power from the stationary equipment to the movable well construction apparatus, the movable well construction apparatus may comprise a sensor operable to detect an electrical fault associated with the electrical power cable, and the communication cable may transmit information indicative of the electrical fault from the movable well construction apparatus to the stationary equipment to stop the transfer of electrical power from the stationary equipment to the movable well construction apparatus. The communication cable may digitally transmit the information indicative of the electrical fault.

The stationary equipment may comprise: one or more electrical generators; and a transformer having a primary winding and a secondary winding. The primary winding may be electrically coupled to the one or more generators under normal operating conditions, and the secondary winding may be electrically coupled to the electrical power cable under the normal operating conditions.

The electrical power cable may transfer electrical power from the stationary equipment to the movable well construction apparatus, the electrical power cable may comprise a plurality of electrical conductors, and the apparatus may further comprise: an electromagnetic transmitter disposed along one of the plurality of electrical conductors and operable to transmit an electrical signal along the one of the plurality of electrical conductors; and an electromagnetic receiver disposed along the one of the plurality of electrical conductors at a distance from the electromagnetic transmitter and operable to receive the electrical signal, wherein differences between the electrical signal that was transmitted and the electrical signal that was received is indicative of impedance of the one of the plurality of electrical conductors. The signal may comprise a frequency that is substantially greater than a frequency of the electrical power transferred via the electrical power cable. The determined impedance of the one of the plurality of electrical conductors may be indicative of an electrical fault associated with the one of the plurality of electrical conductors. The electromagnetic transmitter may comprise: a first electromagnetic coil; and a signal generator electrically connected with the first electromagnetic coil and operable to impart the signal into the first electromagnetic coil to impart the signal into the one of the plurality of electrical conductors. The electromagnetic receiver may comprise: a second electromagnetic coil; and a signal sensor electrically connected with the second electromagnetic coil and operable to receive the signal imparted to the second electromagnetic coil from the one of the plurality of electrical conductors.

The electrical power cable may be enclosed in an electrically insulative material.

The rotatable spool may be capable of winding or unwinding the electrical power cable when the moveable well construction apparatus is moved at the wellsite.

The electrical power cable may extend through cable guards. At least some of the cable guards may be disposed on a ground surface of the wellsite when at least a portion of the electrical power cable is unwound from the rotatable spool, and at least some of the cable guards may be disposed on the rotatable spool when at least a portion of the electrical power cable is wound around the rotatable spool. At least one exterior side of each or some of the cable guards may be textured. Each or some of the cable guards may have a width ranging between 10 centimeters and 30 centimeters in a direction parallel to a direction that the electrical power cable extends through the respective cable guard.

The electrical power cable may carry a plurality of markers distributed along the length of the electrical power cable, and the plurality of markers may visually indicate the electrical power cable when the electrical power cable is unwound from the rotatable spool and disposed along a surface of the wellsite.

The present disclosure also introduces a method comprising: moving a moveable well construction apparatus at a wellsite, wherein a rotatable spool is positioned at and affixed to the moveable well construction apparatus; and reeling or unreeling an electrical power cable onto or from, respectively, the rotatable spool during the movement of the moveable well construction apparatus, wherein the electrical power cable is connected to stationary equipment a distance from the moveable well construction apparatus.

The rotatable spool may be a first rotatable spool, and the method may further comprise reeling or unreeling an electrical communication cable onto or from, respectively, a second rotatable spool during the movement of the moveable well construction apparatus. The electrical communication cable may be connected to the stationary equipment. The electrical power cable may transfer electrical power from the stationary equipment to the movable well construction apparatus. A sensor of the movable well construction apparatus may detect an electrical fault associated with the electrical power cable, and the communication cable may transmit information indicative of the electrical fault from the movable well construction apparatus to the stationary equipment to stop the transfer of electrical power from the stationary equipment to the movable well construction apparatus. The communication cable may digitally transmit the information indicative of the electrical fault.

The stationary equipment may comprise: one or more electrical generators; and a transformer having a primary winding and a secondary winding, wherein the primary winding may be electrically coupled to the one or more generators under normal operating conditions, and the secondary winding may be electrically coupled to the electrical power cable under the normal operating conditions.

The electrical power cable may extend through cable guards. At least some of the cable guards may be disposed on a ground surface of the wellsite when at least a portion of the electrical power cable is unreeled from the rotatable spool, and at least some of the cable guards may be disposed on the rotatable spool when at least a portion of the electrical power cable is reeled in around the rotatable spool. At least one exterior side of each or some of the cable guards may be textured. Each or some of the cable guards may have a width ranging between ten centimeters and thirty centimeters in a direction parallel to a direction that the electrical power cable extends through the respective cable guard.

The present disclosure also introduces an apparatus comprising: (A) a stationary side comprising a stationary power source; (B) a moveable well construction apparatus to be electrically energized via an electrical power transmission path extending between the stationary power source and the moveable well construction apparatus, wherein the electrical power transmission path comprises one or more electrical power cables and one or more electrical connectors; (C) a system comprising a detector, wherein the detector is operable for generating information indicative of whether the electrical power transmission path is properly installed between the stationary power source and the moveable well construction apparatus, and wherein the system is operable for: (i) permitting the electrical power transmission path to be electrically energized when the detector-generated information is indicative of the electrical power transmission path being properly installed between the stationary power source and the moveable well construction apparatus; and (ii) prohibiting the electrical power transmission path from being electrically energized when the detector-generated information is indicative of the electrical power transmission path not being properly installed between the stationary power source and the moveable well construction apparatus.

The system may be at analog, digital, or a combination thereof.

The detector-generated information may be analog data, digital data, or a combination thereof.

The detector-generated information may be transmitted within the system via analog means, digital means, or a combination thereof.

Each electrical connector may be contained within a corresponding protection box, and with regard to each protection box, the detector-generated information may be indicative of: the electrical power transmission path not being properly installed when a human is accessing the protection box; and the electrical power transmission path being properly installed when a human is not accessing the protection box.

Each electrical connector may be contained within a corresponding protection box, each protection box may comprise a lid that is moveable between open and closed positions to permit human access inside the protection box, the detector may comprise one or more sensors each associated with a corresponding protection box and operable to generate information indicative of whether the lid of that protection box is in the closed position, and with regard to each protection box, the detector-generated information may be based on the sensor-generated information. With regard to each protection box, the detector-generated information may be indicative of the electrical power transmission path not being properly installed when the lid is not in the closed position. With regard to each protection box: a corresponding one of the electrical power cables may terminate at a corresponding one of the electrical connectors within the protection box; the lid may comprise an opening through which the corresponding electrical power cable extends; and the opening may be sized to mechanically prevent removal of the corresponding electrical connector from the protection box when the lid is in the closed position.

Each electrical connector may be contained within a corresponding protection box, each protection box may comprise a lid that is moveable between open and closed positions to permit human access inside the protection box, and the system may comprise a locking system that comprises, with respect to each protection box: a key-operated locking system of the protection box that is operable to lock the lid in the closed position via operation of a key in the lock, wherein the key cannot be removed from the lock when the lid is not locked in the closed position; and a receptacle located at the stationary side and able to receive the key. In such implementations, the detector-generated information may be based on whether each key is received in the corresponding stationary side receptacle. The detector-generated information may be indicative of: the electrical power transmission path being properly installed when each key is received in the corresponding stationary side receptacle; and the electrical power transmission path not being properly installed when each key is not received in the corresponding stationary side receptacle. In such implementations, among others within the scope of the present disclosure, the detector may comprise one or more sensors each associated with a corresponding protection box and operable to generate information indicative of whether the lid of that protection box is in the closed position, and with regard to each protection box, the detector-generated information may be further based on the sensor-generated information.

Each electrical connector may be contained within a corresponding protection box, each protection box may comprise a lid that is moveable between open and closed positions to permit human access inside the protection box, and the system may comprise a locking system that comprises: (A) a key-operated lock of each protection box, wherein: (i) the lock of each protection box may be operable to lock the lid of that protection box in the closed position via operation of a key in the lock; (ii) with respect to each protection box, the key may not be able to be removed from the lock when the lid is not locked in the closed position; and (iii) the key may be a single key that operates each of the protection box locks. Such system may comprise a receptacle located at the stationary side and able to receive the key, and the detector-generated information may be based on whether the key is received in the stationary side receptacle. The detector-generated information may be indicative of: the electrical power transmission path being properly installed when the key is received in the stationary side receptacle; and the electrical power transmission path not being properly installed when the key is not received in the stationary side receptacle. The detector may comprise one or more sensors each associated with a corresponding protection box and operable to generate information indicative of whether the lid of that protection box is in the closed position; and with regard to each protection box, the detector-generated information may be further based on the sensor-generated information.

The system may comprise a first conductive path and a second conductive path each extending between the stationary power source and the moveable well construction apparatus in parallel with the electrical power transmission path, the first and second conductive paths may each comprise one or more wires, the detector may be operable to measure impedance between the first and second conductive paths, the system may comprise an impedance device between each pair of electrical connections along the electrical power transmission path, each impedance device may have a known impedance, and the system may be operable to determine, based on the measured and known impedances, whether the electrical power transmission path is properly installed between the stationary power source and the moveable well construction apparatus. The one or more electrical cables may comprise the corresponding one or more wires of each of the first and second conductive paths.

The one or more wires of each of the first and second conductive paths may each be insulated wires. In such implementations, among others within the scope of the present disclosure: (A) the one or more electrical cables may comprise the corresponding one or more insulated wires of each of the first and second conductive paths; (B) the one or more electrical cables may comprise corresponding one or more uninsulated wires of a ground path of the electrical power transmission path; (C) each electrical connector may comprise: (i) a first pin-and-socket connector connecting two of the insulated wires of the first conductive path; (ii) a second pin-and-socket connector connecting two of the insulated wires of the second conductive path; and (iii) a third pin-and-socket connector connecting two of the uninsulated wires of the ground path; (D) the first pin-and-socket connector may comprise a first pin; (E) the second pin-and-socket connector may comprise a second pin; and (F) the third pin-and-socket connector may comprise a third pin that is longer than the first and second pins. When connecting each connector, the first and second pins may connect with corresponding first and second sockets of the first and second pin-and-socket connectors after the third pin connects with a third socket of the third pin-and-socket connector. When disconnecting each connector, the first and second pins may disconnect from the first and second sockets before the third pin disconnects from the third socket.

The one or more wires of the first conductive path may each be insulated wires, and the one or more wires of the second conductive path may each be uninsulated wires. The second conductive path may be a ground path of the electrical power transmission path. The one or more electrical cables may comprise: the corresponding one or more insulated wires of the first conductive path; and the corresponding one or more uninsulated wires of the ground path. Each electrical connector may comprise: a first pin-and-socket connector connecting two of the insulated wires of the first conductive path; and a second pin-and-socket connector connecting two of the uninsulated wires of the ground path. The first pin-and-socket connector may comprise a first pin; and the second pin-and-socket connector may comprise a second pin that is longer than the first pin. When connecting each connector, the first pin may connect with a first socket of the first pin-and-socket connector after the second pin connects with a second socket of the second pin-and-socket connector. When disconnecting each connector, the first pin may disconnect from the first socket before the second pin disconnects from the second socket.

The detector may be located at the moveable well construction apparatus, and the system may comprise: a receiving interface at the stationary side; and a communication link by which the detector-generated information is transmitted to the receiving interface.

Each electrical connector may be contained within a corresponding protection box, each protection box may comprise a lid that is moveable between open and closed positions to permit human access inside the protection box, the detector may comprise one or more sensors each associated with a corresponding protection box and operable to generate information indicative of whether the lid of that protection box is in the closed position, and with regard to each protection box, the detector-generated information may be further based on the sensor-generated information.

Each electrical connector may be contained within a corresponding protection box, each protection box may comprise a lid that is moveable between open and closed positions to permit human access inside the protection box, the system may comprise the above-described locking system, the detector-generated information may be further based on whether each key is received in the corresponding stationary side receptacle, the detector may comprise one or more sensors each associated with a corresponding protection box and operable to generate information indicative of whether the lid of that protection box is in the closed position, and with regard to each protection box, the detector-generated information may be further based on the sensor-generated information.

The detector may comprise: a transmitter operable to inject a signal into a corresponding wire of the electrical power transmission path; and a receiver operable to detect the signal at a different location along the corresponding wire, wherein the detector-generated information may be based on the detected signal.

The present disclosure also introduces a method comprising: (A) moving a moveable well construction apparatus relative to a stationary side, wherein the stationary side comprises a stationary power source, wherein the moveable well construction apparatus is to be electrically energized via an electrical power transmission path extending between the stationary power source and the moveable well construction apparatus, and wherein the electrical power transmission path comprises one or more electrical power cables and one or more electrical connectors; and (B) operating a system comprising a detector, wherein the detector is operable for generating information indicative of whether the electrical power transmission path is properly installed between the stationary power source and the moveable well construction apparatus, and wherein the system is operable for: (i) permitting the electrical power transmission path to be electrically energized when the detector-generated information is indicative of the electrical power transmission path being properly installed between the stationary power source and the moveable well construction apparatus; and (ii) prohibiting the electrical power transmission path from being electrically energized when the detector-generated information is indicative of the electrical power transmission path not being properly installed between the stationary power source and the moveable well construction apparatus.

Each electrical connector may be contained within a corresponding protection box, each protection box may comprise a lid that is moveable between open and closed positions to permit human access inside the protection box, the detector may comprise one or more sensors each associated with a corresponding protection box and operable to generate information indicative of whether the lid of that protection box is in the closed position, with regard to each protection box the detector-generated information may be based on the sensor-generated information, and the method may comprise moving the lid of each protection box to the closed position.

Each electrical connector may be contained within a corresponding protection box, each protection box may comprise a lid that is moveable between open and closed positions to permit human access inside the protection box, and the system may comprise a locking system that comprises, with respect to each protection box: a key-operated lock of the protection box that is operable to lock the lid in the closed position via operation of a key in the lock, wherein the key cannot be removed from the lock when the lid is not locked in the closed position; and a receptacle located at the stationary side and able to receive the key. In such implementations, among others within the scope of the present disclosure, the detector-generated information may be based on whether each key is received in the corresponding stationary side receptacle, and the method may comprise: locking each protection box with the corresponding key; removing each key from the corresponding locked protection box; and inserting each key into the corresponding stationary side receptacle. The detector may comprise one or more sensors each associated with a corresponding protection box and operable to generate information indicative of whether the lid of that protection box is in the closed position, with regard to each protection box the detector-generated information may be based on the sensor-generated information, and the method may comprise moving the lid of each protection box to the closed position.

Each electrical connector may be contained within a corresponding protection box, each protection box may comprise a lid that is moveable between open and closed positions to permit human access inside the protection box, and the system may comprise a locking system that comprises: (A) a key-operated lock of each protection box, wherein: (i) the lock of each protection box is operable to lock the lid of that protection box in the closed position via operation of a key in the lock; (ii) with respect to each protection box, the key cannot be removed from the lock when the lid is not locked in the closed position; and (iii) the key is a single key that operates each of the protection box locks; and (B) a receptacle located at the stationary side and able to receive the key. In such implementations, among others within the scope of the present disclosure, the detector-generated information may be based on whether the key is received in the stationary side receptacle, and the method may comprise: locking each protection box with the key; and inserting the key into the stationary side receptacle. In such implementations, among others within the scope of the present disclosure, the detector may comprise one or more sensors each associated with a corresponding protection box and operable to generate information indicative of whether the lid of that protection box is in the closed position, with regard to each protection box the detector-generated information may be based on the sensor-generated information, and the method may comprise moving the lid of each protection box to the closed position.

The system may comprise a first conductive path and a second conductive path each extending between the stationary power source and the moveable well construction apparatus in parallel with the electrical power transmission path. The first and second conductive paths may each comprise one or more wires. The detector may be operable to measure impedance between the first and second conductive paths. The method may comprise placing an impedance device between each pair of electrical connections along the electrical power transmission path. Each impedance device may have known impedance. The system may be operable to determine, based on the measured and known impedances, whether the electrical power transmission path is properly installed between the stationary power source and the moveable well construction apparatus. In such implementations, among others within the scope of the present disclosure: (A) each electrical connector may be contained within a corresponding protection box; (B) each protection box may comprise a lid that is moveable between open and closed positions to permit human access inside the protection box; (C) the detector may comprise one or more sensors each associated with a corresponding protection box and operable to generate information indicative of whether the lid of that protection box is in the closed position; (D) with regard to each protection box, the detector-generated information may be based on the sensor-generated information; and (E) the method may comprise moving the lid of each protection box to the closed position. Alternatively, or additionally: (A) each electrical connector may be contained within a corresponding protection box; (B) each protection box may comprise a lid that is moveable between open and closed positions to permit human access inside the protection box; (C) the system may comprise a locking system that comprises, with respect to each protection box: (i) a key-operated lock of the protection box that is operable to lock the lid in the closed position via operation of a key in the lock, wherein the key cannot be removed from the lock when the lid is not locked in the closed position; and (ii) a receptacle located at the stationary side and able to receive the key; (D) the detector-generated information may be based on whether each key is received in the corresponding stationary side receptacle; and (E) the method may comprise: (i) locking each protection box with the corresponding key; (ii) removing each key from the corresponding locked protection box; and (iii) inserting each key into the corresponding stationary side receptacle. In such implementations, among others within the scope of the present disclosure: (A) the detector may comprise one or more sensors each associated with a corresponding protection box and operable to generate information indicative of whether the lid of that protection box is in the closed position; (B) with regard to each protection box, the detector-generated information may be based on the sensor-generated information; and (C) the method may comprise moving the lid of each protection box to the closed position.

One or more aspects described above may also be applicable or readily adaptable to drilling rigs other than the moveable well construction apparatus described above and depicted in the figures. Such other rigs may be stationary or moveable on-shore, offshore, or near-shore rigs. Examples may include jack-up rigs, tender rigs, workover rigs, platform rigs, and/or semi-submersible rigs, among others.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same functions and/or achieving the same benefits of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to permit the reader to quickly ascertain the nature of the technical disclosure. It is submitted with the understanding that it will not be used to interpret or limit the scope or meaning of the claims.

What is claimed is:

1. A method comprising:
   moving a moveable well construction apparatus relative to a stationary side, wherein the stationary side comprises a stationary power source, wherein the moveable well construction apparatus is to be electrically energized via an electrical power transmission path extending between the stationary power source and the moveable well construction apparatus, and wherein the electrical power transmission path comprises one or more electrical power cables and one or more electrical connectors; and
   operating a system comprising a detector, wherein the detector is operable for generating information indicative of whether the electrical power transmission path is properly installed between the stationary power source and the moveable well construction apparatus, and wherein the system is operable for:
      permitting the electrical power transmission path to be electrically energized when the detector-generated information is indicative of the electrical power transmission path being properly installed between the stationary power source and the moveable well construction apparatus; and
      prohibiting the electrical power transmission path from being electrically energized when the detector-generated information is indicative of the electrical power transmission path not being properly installed between the stationary power source and the moveable well construction apparatus.

2. The method of claim 1 wherein:

each electrical connector is contained within a corresponding protection box;

each protection box comprises a lid that is moveable between open and closed positions to permit human access inside the protection box;

the detector comprises one or more sensors each associated with a corresponding protection box and operable to generate information indicative of whether the lid of that protection box is in the closed position;

with regard to each protection box, the detector-generated information is based on the sensor-generated information; and the method further comprises moving the lid of each protection box to the closed position.

3. The method of claim 1 wherein:

each electrical connector is contained within a corresponding protection box;

each protection box comprises a lid that is moveable between open and closed positions to permit human access inside the protection box;

the system comprises a locking system that comprises, with respect to each protection box:
  a key-operated lock of the protection box that is operable to lock the lid in the closed position via operation of a key in the lock, wherein the key cannot be removed from the lock when the lid is not locked in the closed position; and
  a receptacle located at the stationary side and able to receive the key;

the detector-generated information is based on whether each key is received in the corresponding stationary side receptacle; and the method further comprises:
  locking each protection box with the corresponding key;
  removing each key from the corresponding locked protection box; and
  inserting each key into the corresponding stationary side receptacle.

4. The method of claim 3 wherein the detector comprises one or more sensors each associated with a corresponding protection box and operable to generate information indicative of whether the lid of that protection box is in the closed position;

with regard to each protection box, the detector-generated information is based on the sensor-generated information; and the method further comprises moving the lid of each protection box to the closed position.

5. The method of claim 1 wherein:

each electrical connector is contained within a corresponding protection box;

each protection box comprises a lid that is moveable between open and closed positions to permit human access inside the protection box;

the system comprises a locking system that comprises:
  a key-operated lock of each protection box, wherein:
    the lock of each protection box is operable to lock the lid of that protection box in the closed position via operation of a key in the lock;
    with respect to each protection box, the key cannot be removed from the lock when the lid is not locked in the closed position; and
    the key is a single key that operates each of the protection box locks; and
  a receptacle located at the stationary side and able to receive the key;

the detector-generated information is based on whether the key is received in the stationary side receptacle; and the method further comprises:
  locking each protection box with the key; and
  inserting the key into the stationary side receptacle.

6. The method of claim 5 wherein the detector comprises one or more sensors each associated with a corresponding protection box and operable to generate information indicative of whether the lid of that protection box is in the closed position;

with regard to each protection box, the detector-generated information is based on the sensor-generated information; and the method further comprises moving the lid of each protection box to the closed position.

7. The method of claim 1 wherein:

the system comprises a first conductive path and a second conductive path each extending between the stationary power source and the moveable well construction apparatus in parallel with the electrical power transmission path;

the first and second conductive paths each comprise one or more wires;

the detector is operable to measure impedance between the first and second conductive paths;

the method further comprises placing an impedance device between each pair of electrical connections along the electrical power transmission path;

each impedance device has a known impedance; and the system is operable to determine, based on the measured and known impedances, whether the electrical power transmission path is properly installed between the stationary power source and the moveable well construction apparatus.

8. The method of claim 7 wherein:

each electrical connector is contained within a corresponding protection box;

each protection box comprises a lid that is moveable between open and closed positions to permit human access inside the protection box;

the detector comprises one or more sensors each associated with a corresponding protection box and operable to generate information indicative of whether the lid of that protection box is in the closed position;

with regard to each protection box, the detector-generated information is based on the sensor-generated information; and the method further comprises moving the lid of each protection box to the closed position.

9. The method of claim 7 wherein:

each electrical connector is contained within a corresponding protection box;

each protection box comprises a lid that is moveable between open and closed positions to permit human access inside the protection box;

the system comprises a locking system that comprises, with respect to each protection box:
  a key-operated lock of the protection box that is operable to lock the lid in the closed position via operation of a key in the lock, wherein the key cannot be removed from the lock when the lid is not locked in the closed position; and
a receptacle located at the stationary side and able to receive the key;

the detector-generated information is based on whether each key is received in the corresponding stationary side receptacle; and the method further comprises:
locking each protection box with the corresponding key;
removing each key from the corresponding locked protection box; and
inserting each key into the corresponding stationary side receptacle.

10. The method of claim 9 wherein the detector comprises one or more sensors each associated with a corresponding protection box and operable to generate information indicative of whether the lid of that protection box is in the closed position;
with regard to each protection box, the detector-generated information is based on the sensor-generated information; and
the method further comprises moving the lid of each protection box to the closed position.

11. The method of claim 7 wherein:
each electrical connector is contained within a corresponding protection box;
each protection box comprises a lid that is moveable between open and closed positions to permit human access inside the protection box;
the system comprises a locking system that comprises:
a key-operated lock of each protection box, wherein:
the lock of each protection box is operable to lock the lid of that protection box in the closed position via operation of a key in the lock;
with respect to each protection box, the key cannot be removed from the lock when the lid is not locked in the closed position; and
the key is a single key that operates each of the protection box locks; and
a receptacle located at the stationary side and able to receive the key;
the detector-generated information is based on whether the key is received in the stationary side receptacle; and
the method further comprises:
locking each protection box with the key; and
inserting the key into the stationary side receptacle.

12. The method of claim 11 wherein the detector comprises one or more sensors each associated with a corresponding protection box and operable to generate information indicative of whether the lid of that protection box is in the closed position;
with regard to each protection box, the detector-generated information is based on the sensor-generated information; and
the method further comprises moving the lid of each protection box to the closed position.

* * * * *